US012635235B2

(12) United States Patent (10) Patent No.: US 12,635,235 B2
Liang et al. (45) Date of Patent: May 19, 2026

(54) SEMICONDUCTOR DEVICES AND METHODS OF FABRICATING THE SAME

(71) Applicant: Taiwan Semiconductor Manufacturing Company, Ltd., Hsinchu (TW)

(72) Inventors: Shuen-Shin Liang, Hsinchu (TW); Hong-Mao Lee, Hsinchu (TW); Sung-Li Wang, Hsinchu (TW); Yan-Ming Tsai, Hsinchu (TW); Po-Chin Chang, Hsinchu (TW); Wei-Yip Loh, Hsinchu (TW); Harry Chien, Hsinchu (TW); Pei-Hua Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 378 days.

(21) Appl. No.: 18/326,241

(22) Filed: May 31, 2023

(65) Prior Publication Data
US 2024/0405023 A1 Dec. 5, 2024

(51) Int. Cl.
*H01L 29/76* (2006.01)
*H01L 29/94* (2006.01)
(Continued)

(52) U.S. Cl.
CPC ........... *H10D 84/853* (2025.01); *H10D 62/83* (2025.01); *H10D 64/01* (2025.01); *H10D 64/017* (2025.01);
(Continued)

(58) Field of Classification Search
CPC ...... H10D 84/853; H10D 62/83; H10D 64/01; H10D 64/017; H10D 64/62;
(Continued)

(56) References Cited

U.S. PATENT DOCUMENTS

2018/0151679 A1 5/2018 Wang et al.
2019/0252381 A1* 8/2019 Liu ........................ H10D 84/85
(Continued)

FOREIGN PATENT DOCUMENTS

TW 202209569 A 3/2022
TW 202230631 A 8/2022
(Continued)

OTHER PUBLICATIONS

Office Action issued in connection with Taiwan Appl. No. 112126628 dated Feb. 7, 2025.

*Primary Examiner* — Theresa T Doan
(74) *Attorney, Agent, or Firm* — Foley & Lardner LLP

(57) ABSTRACT

A semiconductor device includes a semiconductor fin protruding from a substrate. The semiconductor device includes a P-type device over the semiconductor fin and an N-type device over the semiconductor fin. The P-type device includes a first source/drain (S/D) feature adjacent a first gate structure. The P-type device includes a dipole layer over the first S/D feature, where the dipole layer includes a first metal and a second metal different from the first metal. The P-type device further includes a first silicide layer over the dipole layer, where the first silicide layer includes the first metal. The N-type device includes a second S/D feature adjacent a second gate structure. The N-type device further includes a second silicide layer directly contacting the second S/D feature, where the second silicide layer includes the first metal, and where a composition of the second silicide layer is different from that of the dipole layer.

20 Claims, 35 Drawing Sheets

(51) Int. Cl.

| | | |
|---|---|---|
| *H10D 62/83* | (2025.01) | |
| *H10D 64/01* | (2025.01) | |
| *H10D 64/62* | (2025.01) | |
| *H10D 84/01* | (2025.01) | |
| *H10D 84/03* | (2025.01) | |
| *H10D 84/85* | (2025.01) | |

(52) U.S. Cl.
CPC ......... *H10D 64/62* (2025.01); *H10D 84/0193* (2025.01); *H10D 84/038* (2025.01)

(58) Field of Classification Search
CPC ............. H10D 84/0193; H10D 84/038; H10D 30/0212; H10D 30/6219; H10D 62/121; H10D 62/151
USPC ........................................................ 257/369
See application file for complete search history.

(56) References Cited

U.S. PATENT DOCUMENTS

| | | | |
|---|---|---|---|
| 2020/0119152 A1 | 4/2020 | Wang et al. | |
| 2021/0407851 A1 | 12/2021 | Bomberger et al. | |

FOREIGN PATENT DOCUMENTS

| | | | |
|---|---|---|---|
| TW | 202238674 A | 10/2022 | |
| TW | 202238731 A | 10/2022 | |
| TW | 202242551 A | 11/2022 | |
| TW | 202312492 A | 3/2023 | |

\* cited by examiner

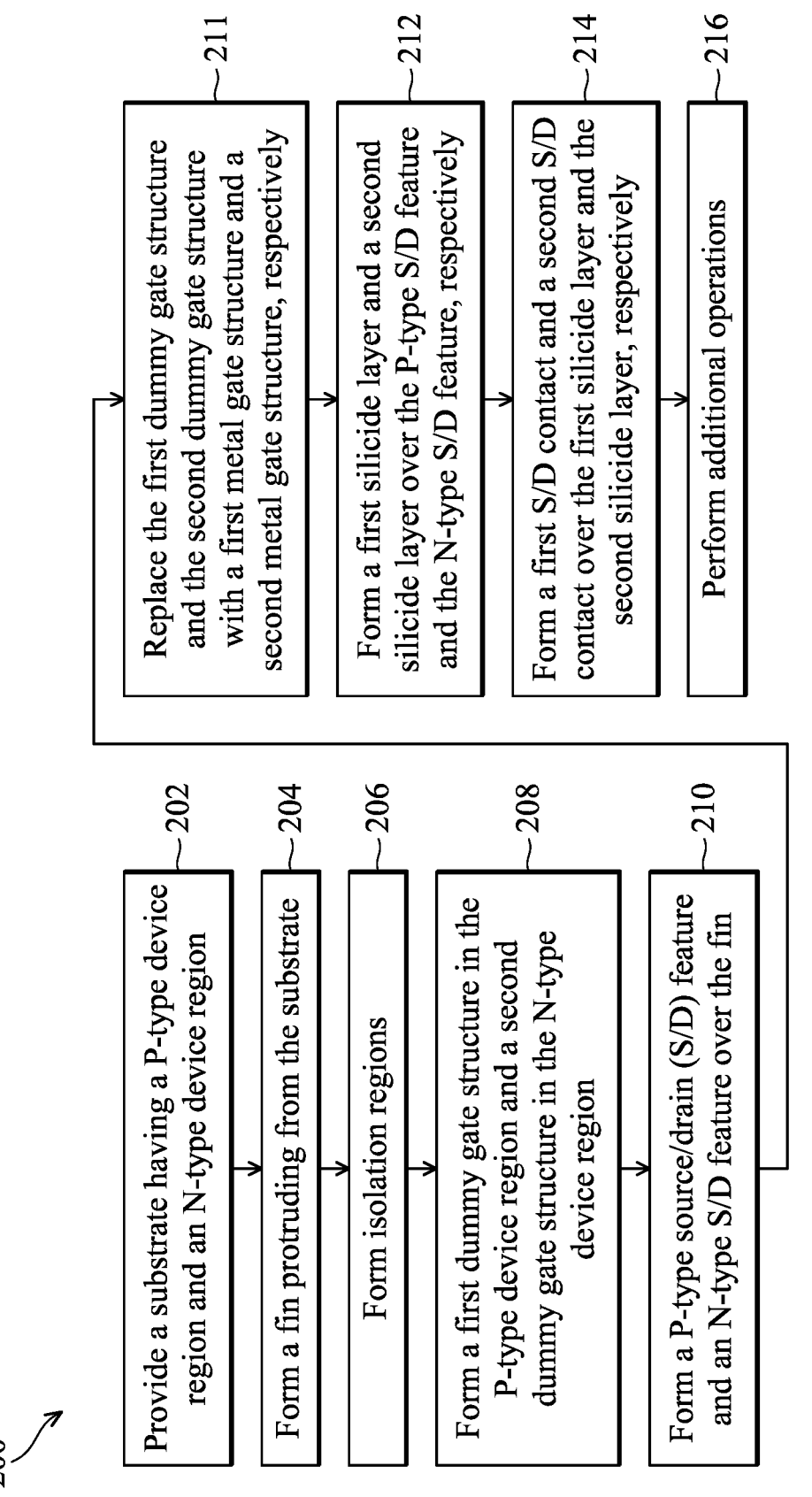

200

Provide a substrate having a P-type device region and an N-type device region — 202

Form a fin protruding from the substrate — 204

Form isolation regions — 206

Form a first dummy gate structure in the P-type device region and a second dummy gate structure in the N-type device region — 208

Form a P-type source/drain (S/D) feature and an N-type S/D feature over the fin — 210

Replace the first dummy gate structure and the second dummy gate structure with a first metal gate structure and a second metal gate structure, respectively — 211

Form a first silicide layer and a second silicide layer over the P-type S/D feature and the N-type S/D feature, respectively — 212

Form a first S/D contact and a second S/D contact over the first silicide layer and the second silicide layer, respectively — 214

Perform additional operations — 216

FIG. 2A

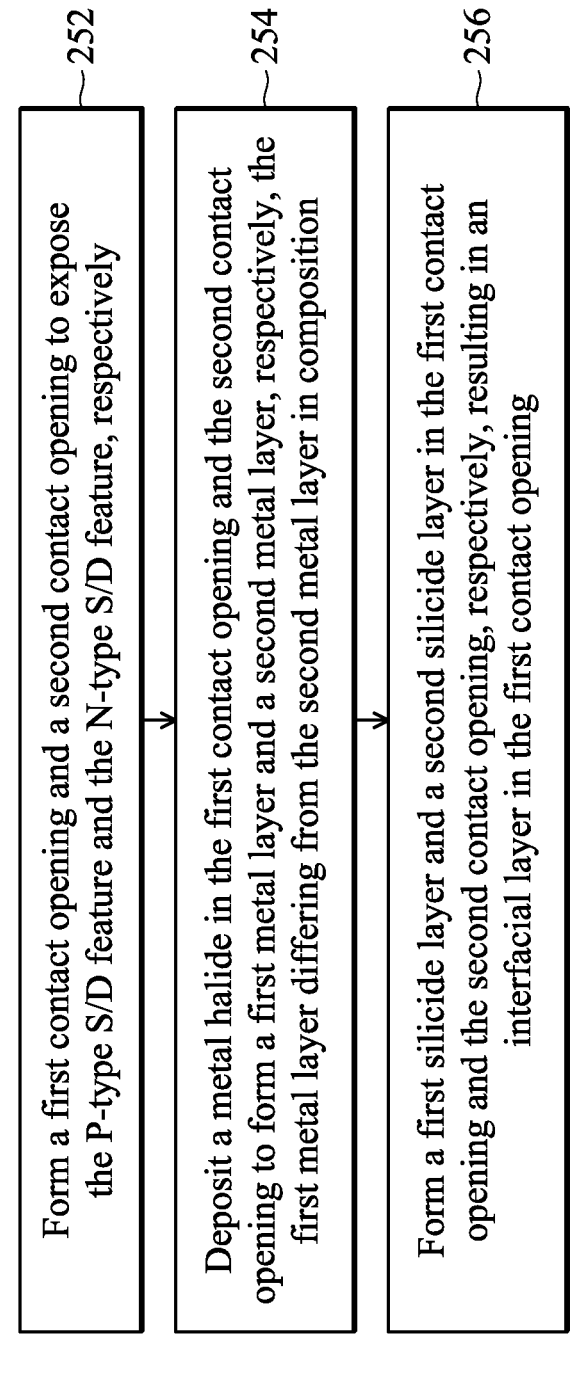

250

252 — Form a first contact opening and a second contact opening to expose the P-type S/D feature and the N-type S/D feature, respectively 254 — Deposit a metal halide in the first contact opening and the second contact opening to form a first metal layer and a second metal layer, respectively, the first metal layer differing from the second metal layer in composition 256 — Form a first silicide layer and a second silicide layer in the first contact opening and the second contact opening, respectively, resulting in an interfacial layer in the first contact opening

FIG. 2B

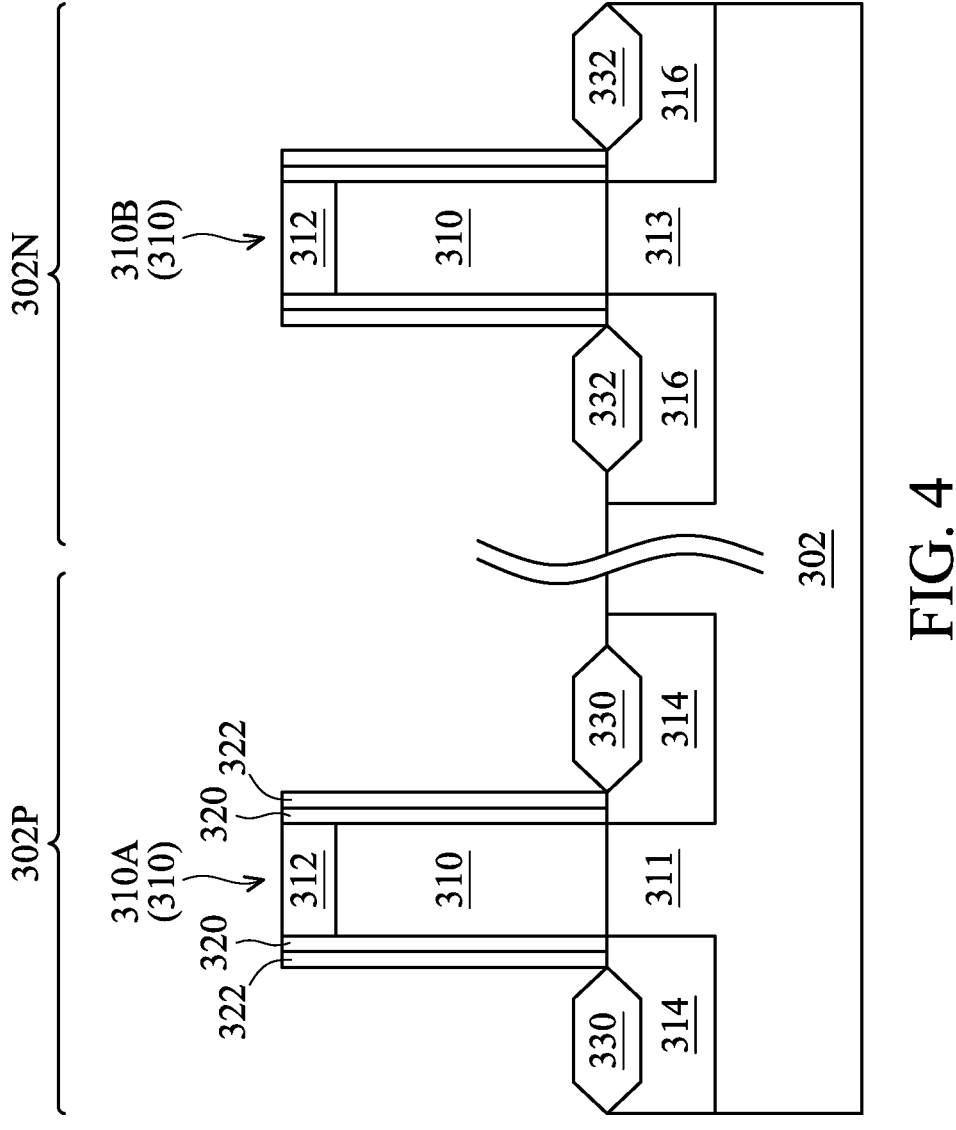
FIG. 4

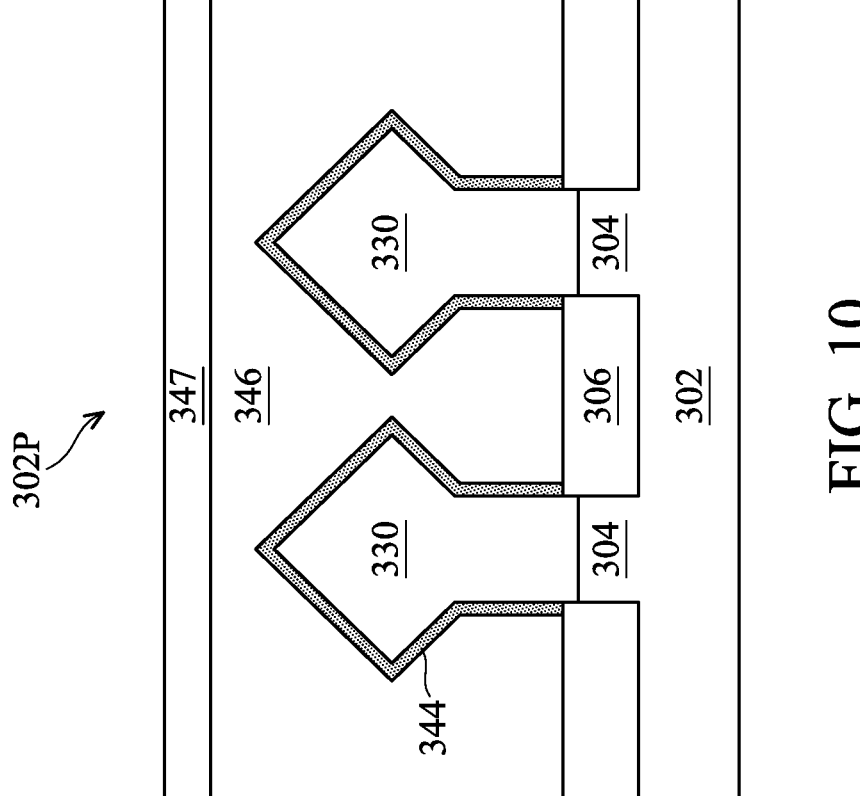
FIG. 10

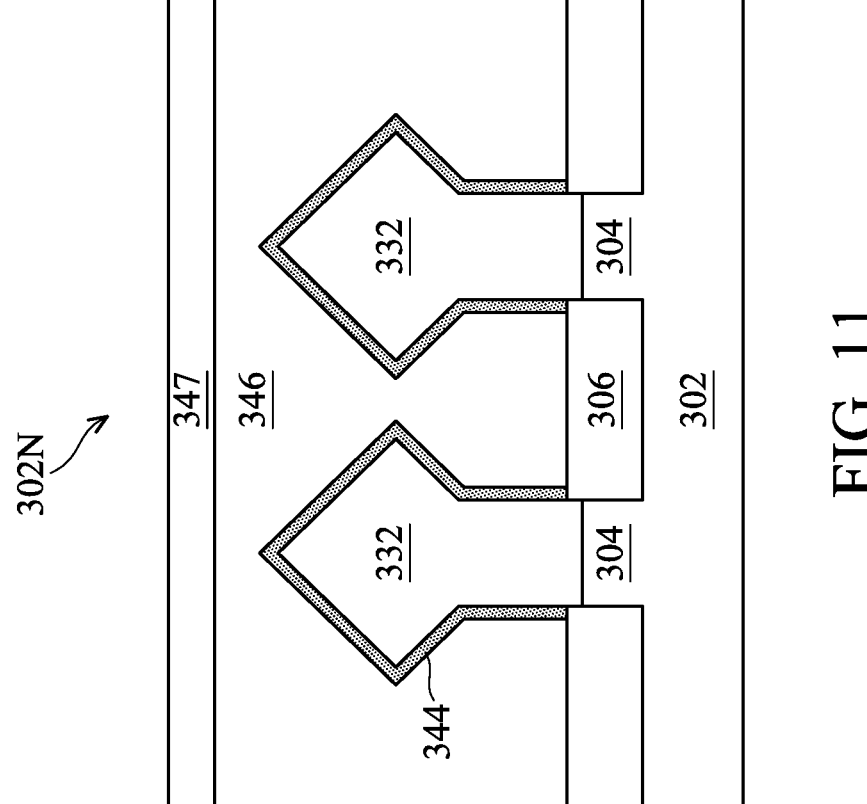
302N
300
FIG. 11

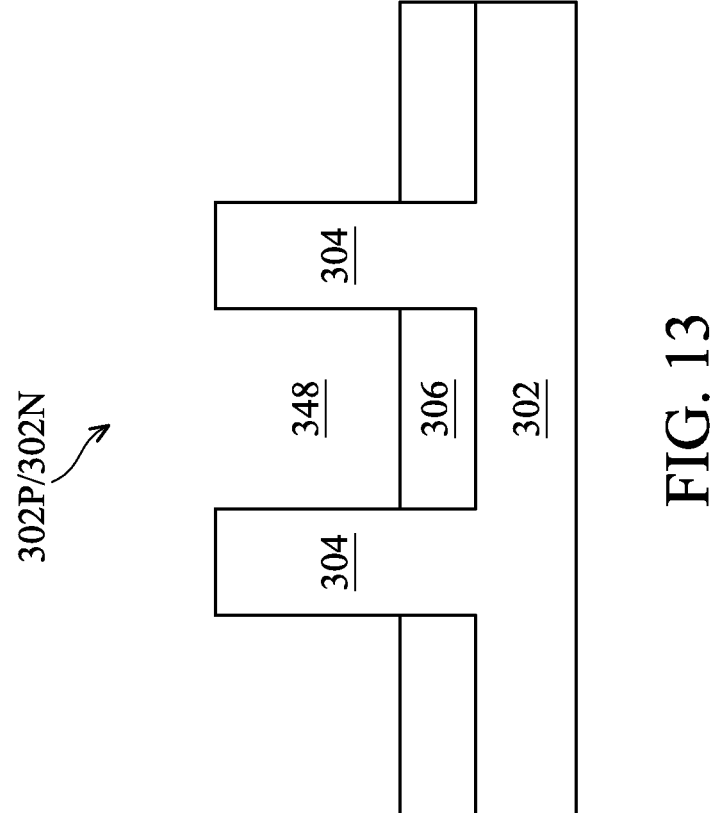
FIG. 13

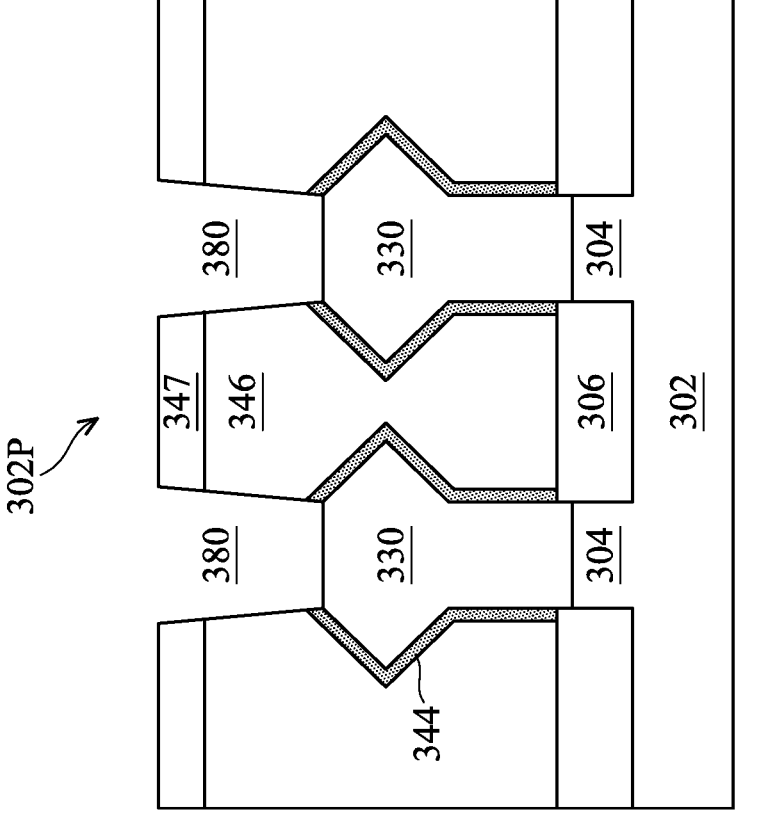
FIG. 17

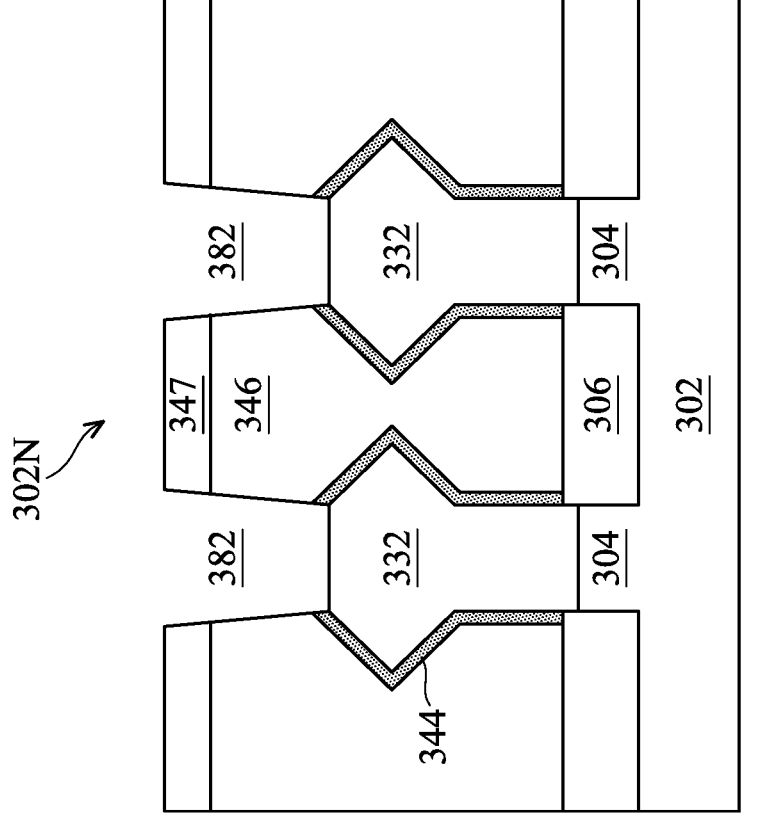
FIG. 18

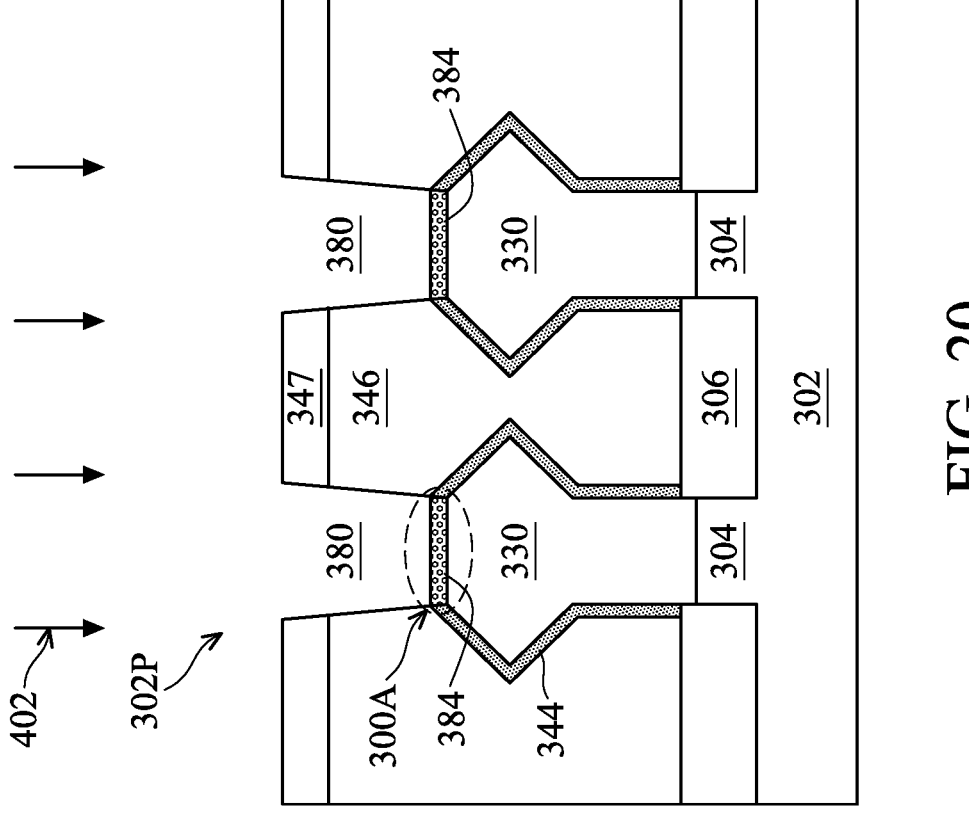
FIG. 20

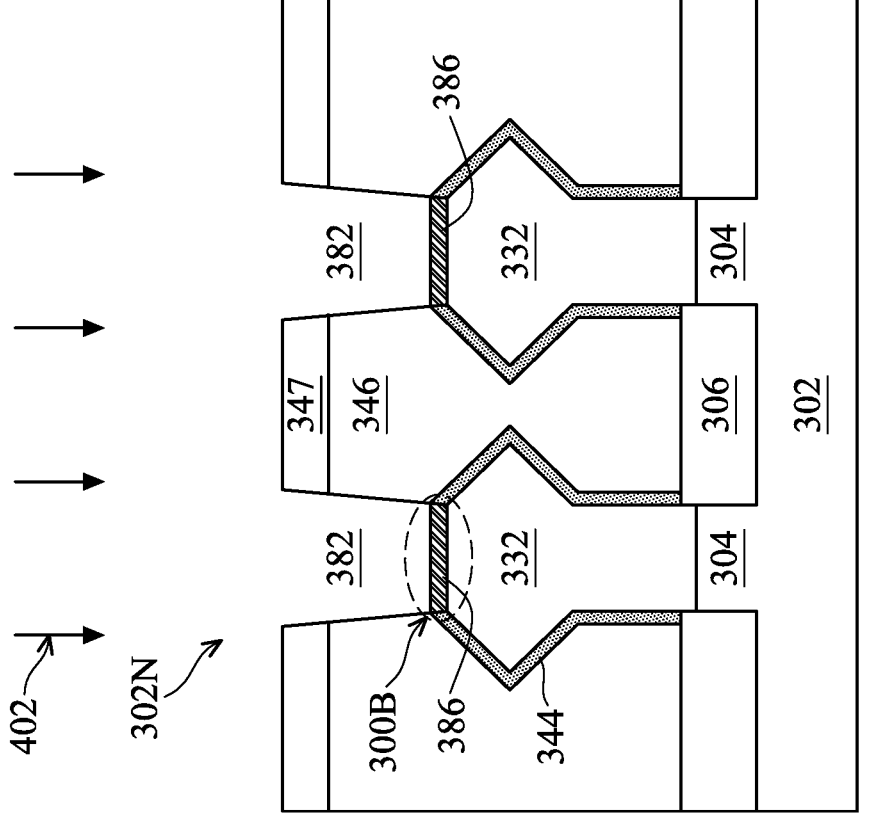
FIG. 21

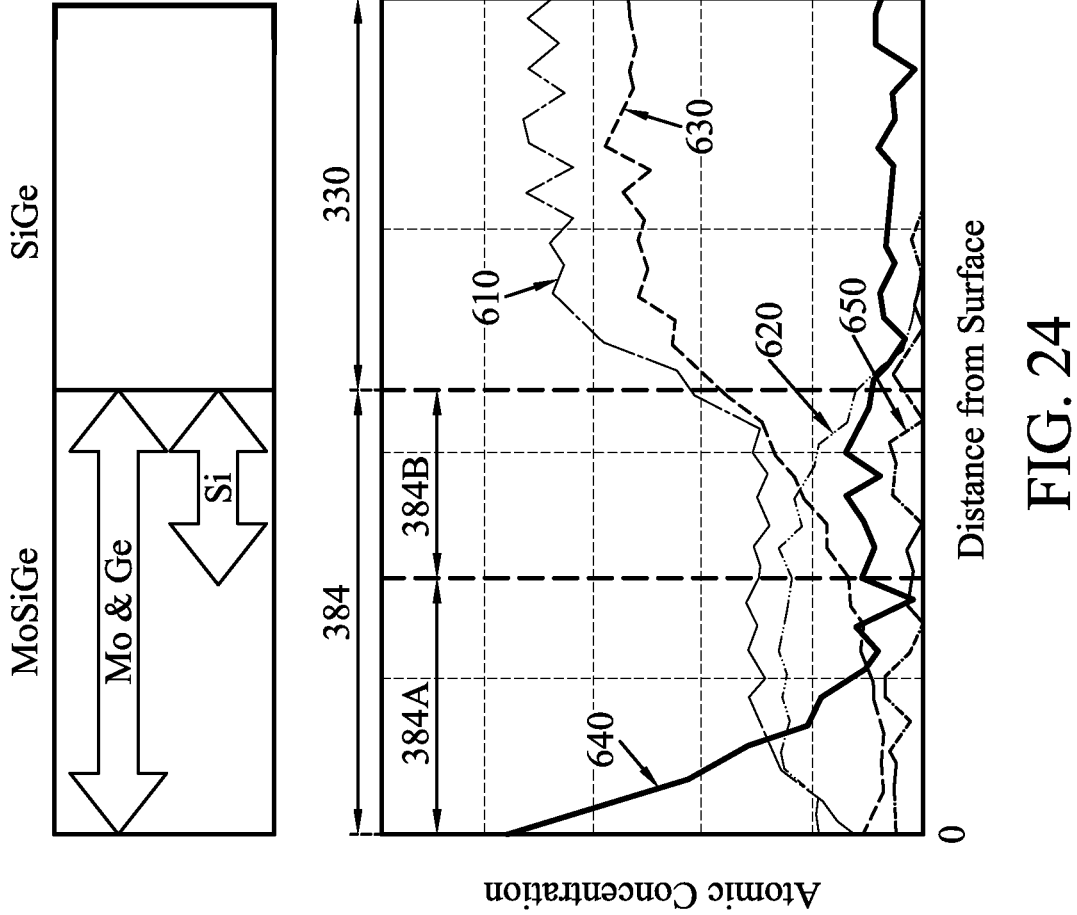
FIG. 24

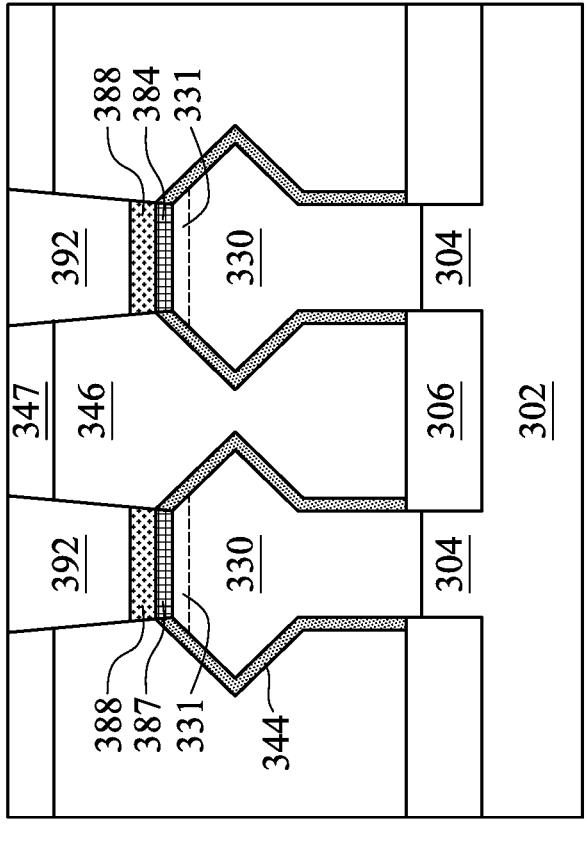
FIG. 31

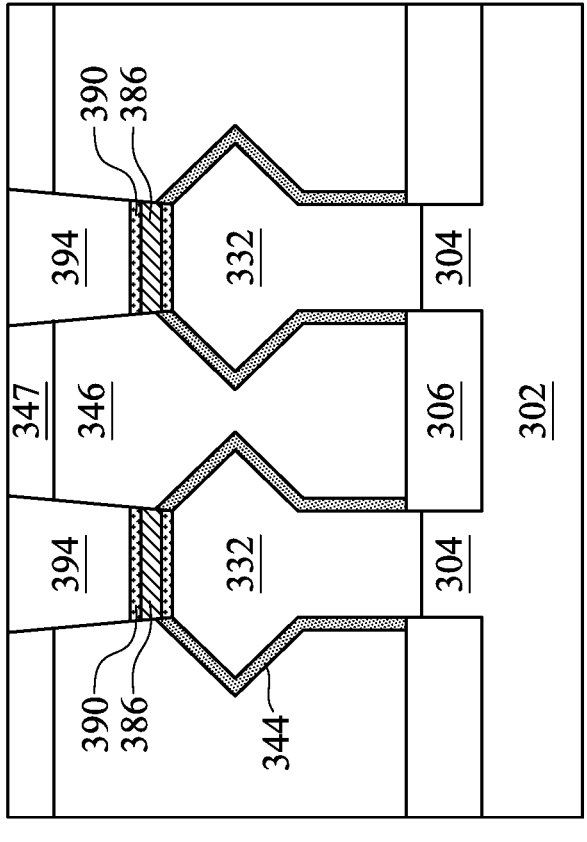
FIG. 32

SEMICONDUCTOR DEVICES AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, reducing contact resistance between a silicide layer and underlying source/drain features device has become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B each illustrate a flow chart of an example method for making an example non-planar transistor, in accordance with some embodiments of the present disclosure.

FIGS. 3, 5, 13, and 15 illustrate cross-sectional views of an example FinFET device (or a portion of the example FinFET device) analogous to the example FinFET device of FIG. 1 along line B-B during various fabrication stages of the example method of FIGS. 2A and/or 2B, in accordance with some embodiments of the present disclosure.

FIGS. 4, 9, 12, 14, 16, 19, 25, and 30 illustrate cross-sectional views of an example FinFET device (or a portion of the example FinFET device) analogous to the example FinFET device of FIG. 1 along line A-A during various fabrication stages of the example method of FIGS. 2A and/or 2B, in accordance with some embodiments of the present disclosure.

FIGS. 6, 7, 8, 10, 11, 17, 18, 20, 21, 22A, 22B, 26, 27, 28A, 28B, 31, and 32 illustrate cross-sectional views of an example FinFET device (or a portion of the example FinFET device) analogous to the example FinFET device of FIG. 1 along line C-C during various fabrication stages of the example method of FIGS. 2A and/or 2B, in accordance with some embodiments of the present disclosure.

Figures 28A, 28B:
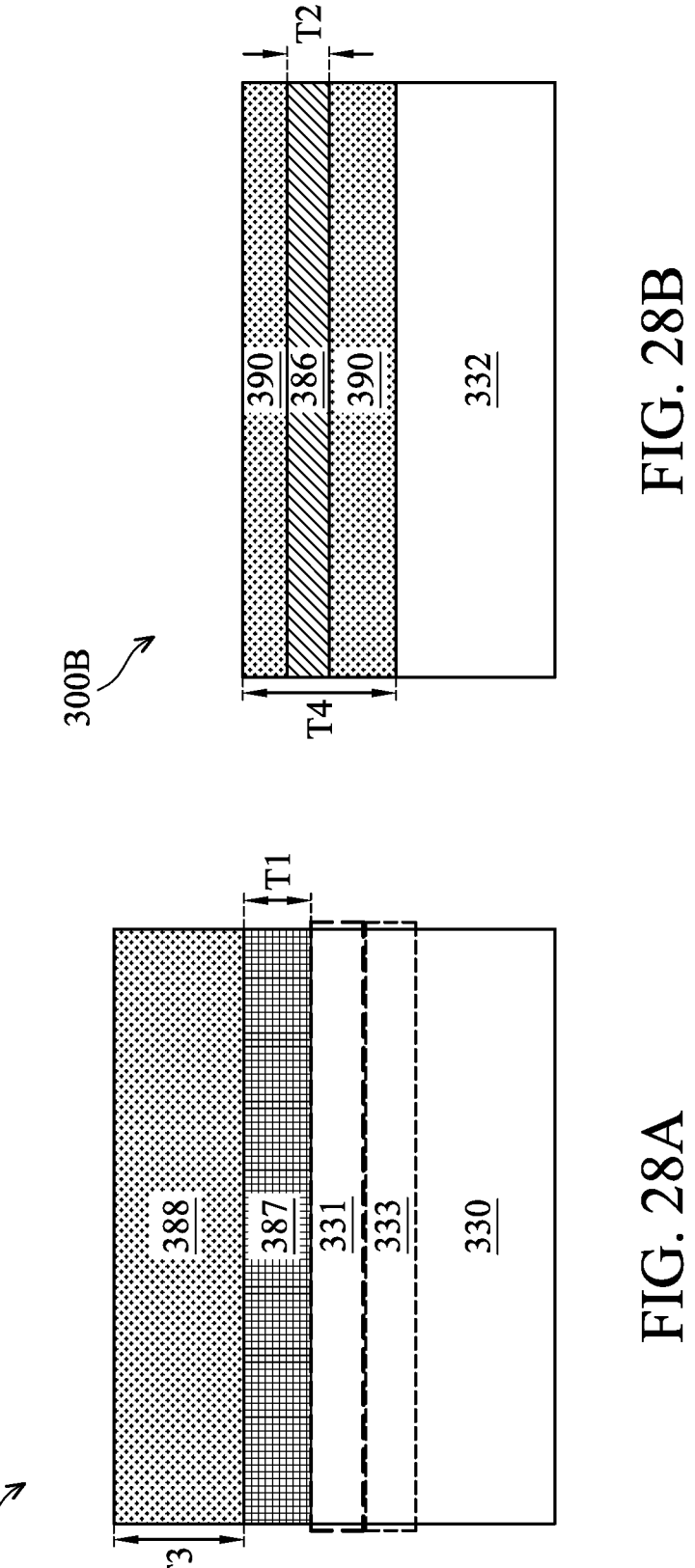
Figure 29:
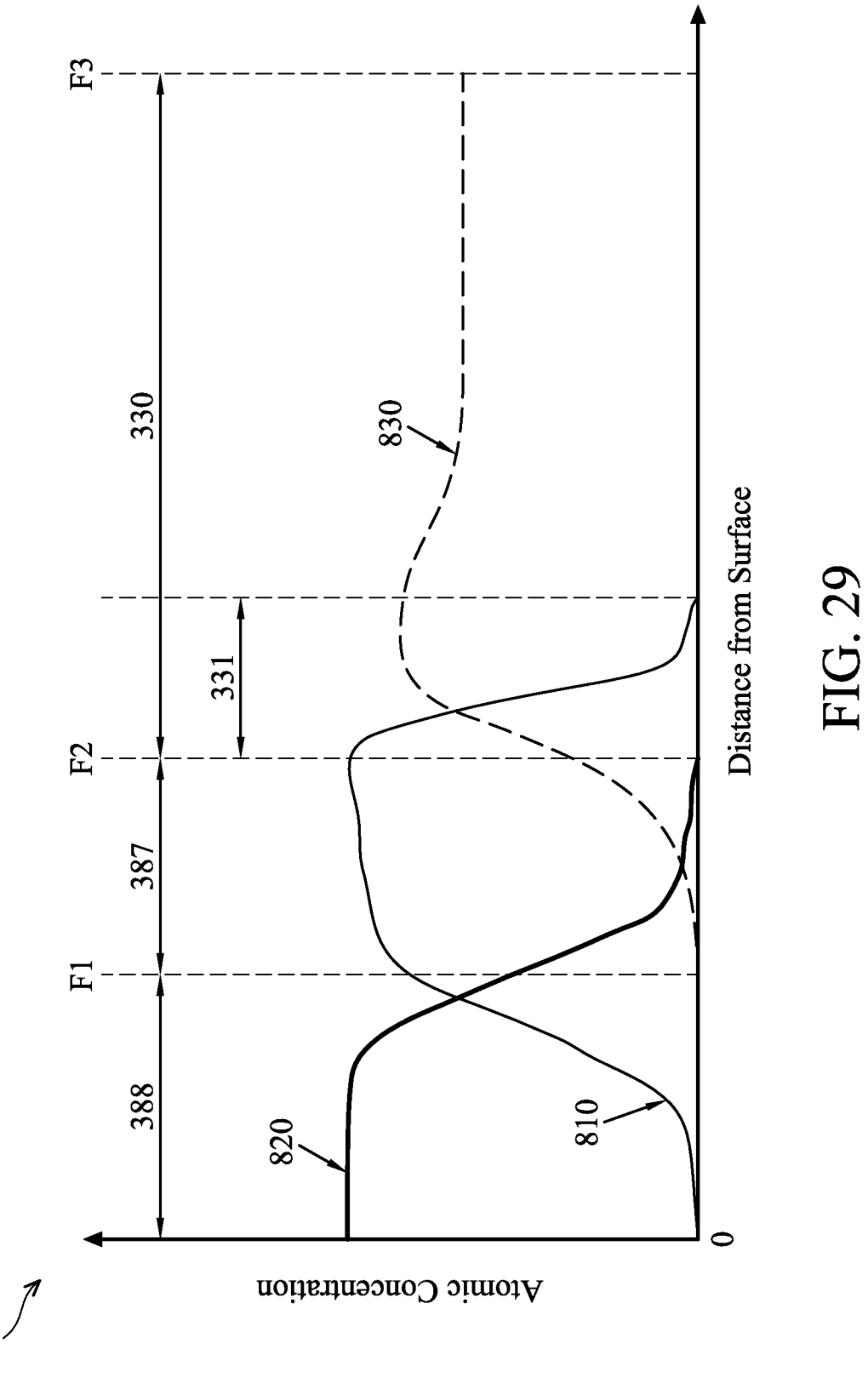
Figure 30:
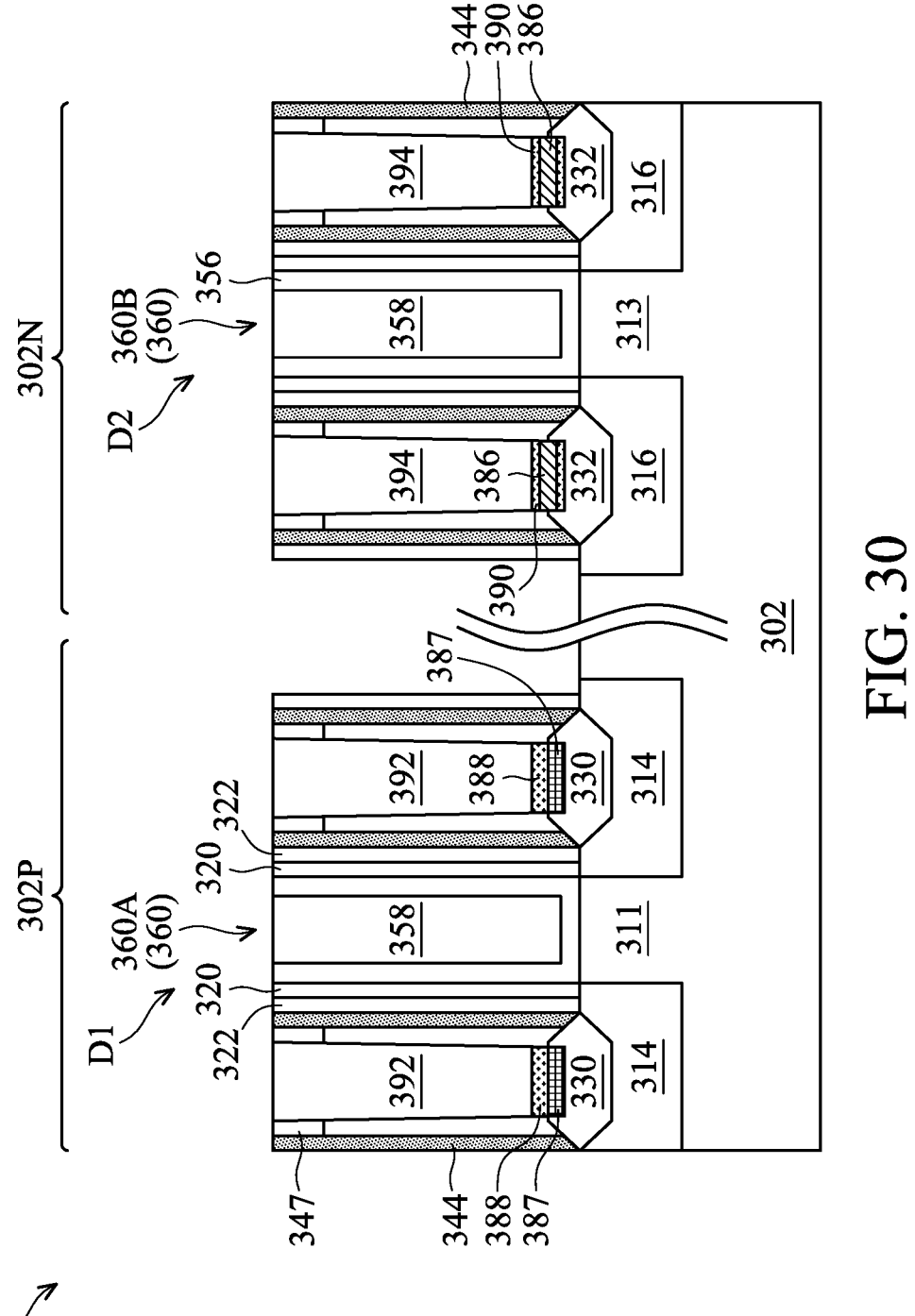

FIGS. 24 and 29 each illustrate concentration profiles of various elements present in portions of the example FinFET device of one or more of FIGS. 3-22B, 25-28B, and 30-33D, in accordance with some embodiments of the present disclosure.

Figure 1:
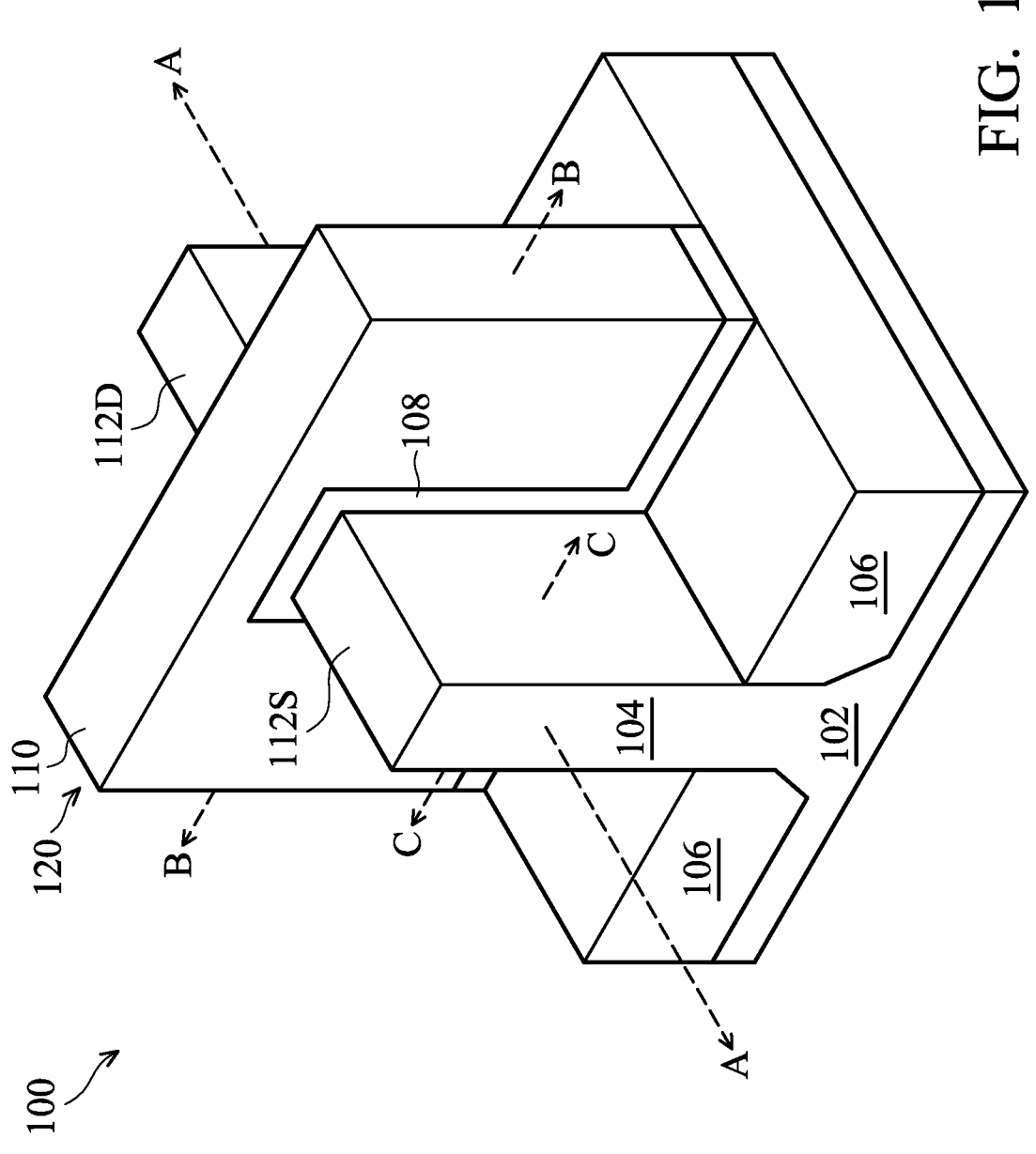
FIG. 1 illustrates a three-dimensional perspective view of an example non-planar semiconductor device, such as a fin field-effect transistor (FinFET) device, in accordance with some embodiments of the present disclosure.

FIGS. 33A, 33B, 33C, and 33D illustrate cross-sectional views of an example vertical multi-gate device (or a portion of the example vertical multi-gate device) analogous to the example FinFET device of FIG. 1 along line C-C during various fabrication stages of the example method of FIGS. 2A and/or 2B, in accordance with some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As a non-limiting example, the terms "about" and "approximately" refers to a range of plus or minus 10% of the stated value. For example, about 0.5 would include 0.45 and 0.55, about 10 would include 9 to 11, about 1000 would include 900 to 1100. It is noted that other ranges and percentages may also be applicable according to the understanding of a person ordinarily skilled in the art.

FIG. 1 illustrates a perspective view of an example non-planar semiconductor device (hereafter referred to as device) 100, such as a FinFET or a multi-gate transistor (e.g., a gate-all-around, or GAA, transistor, a vertical multi-gate transistor, etc.), in accordance with various embodiments. The device 100 includes a substrate 102 and a fin 104 protruding above the substrate 102. Isolation regions 106 are formed on opposing sides of the fin 104, with the fin 104 protruding above the isolation regions 106. A gate dielectric layer 108 traverses a channel region of the fin 104, such that it is formed along sidewalls and over a top surface of the fin 104, and a gate electrode 110 is over the gate dielectric layer 108, which together form a gate structure 120. Source/drain regions 112D and 112S (over which source/drain features, not depicted, are formed) are disposed in and over the fin 104 and on opposing sides of the gate dielectric layer 108 and the gate electrode 110. The source/drain regions 112D and 112S extend outward from the gate electrode 110. FIG. 1 is provided as a reference to illustrate a number of cross-sections in subsequent figures. For example, cross-sections illustrated in FIGS. 3, 5, 13, and 15 are taken along line B-B, which extends along a longitudinal axis of the gate structure 120 of the device 100. Cross-sections illustrated in FIGS. 4, 9, 12, 14, 16, 19, 25, and 30 are taken along line A-A, which extends along a longitudinal axis of the fin 104 and in a direction of, for example, a current flow across the channel region of the fin 104 between the source/drain regions 112S/112D. Cross-sections illustrated in FIGS. 6, 7, 8, 10, 11, 17, 18, 20, 21, 22A, 22B, 26, 27, 28A, 28B, 31, and 32 are taken along line C-C, which extends parallel to a longitudinal axis of the gate structure 120 and through the source/drain regions 112S/112D. Subsequent figures refer to these reference cross-sections for clarity.

FIG. 2A illustrates a flowchart of a method 200 to form a non-planar semiconductor device, according to one or more embodiments of the present disclosure. For example, at least some of the operations of the method 200 can be used to form a FinFET, a multi-gate transistor (e.g., a GAA transistor, a vertical transistor, etc.), including a nanosheet transistor or a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2A, and that some other operations may only be briefly described herein. In some embodiments, operations of the method 200 may be associated with cross-sectional views of an example FinFET device 300 (hereafter referred to as device 300) at various fabrication stages as shown in FIGS. 3-22B, 25-28B, and 30-33D, which will be discussed in further detail below. FIG. 2B illustrates a flowchart of a method 250 to form a portion of the device 300, according to one or more embodiments of the present disclosure. Furthermore, embodiments of the device 300 are not limited to those depicted herein. For example, the device 300 may include a number of other devices such as inductors, fuses, capacitors, coils, etc., which are not shown herein for purposes of clarity.

Figure 3:
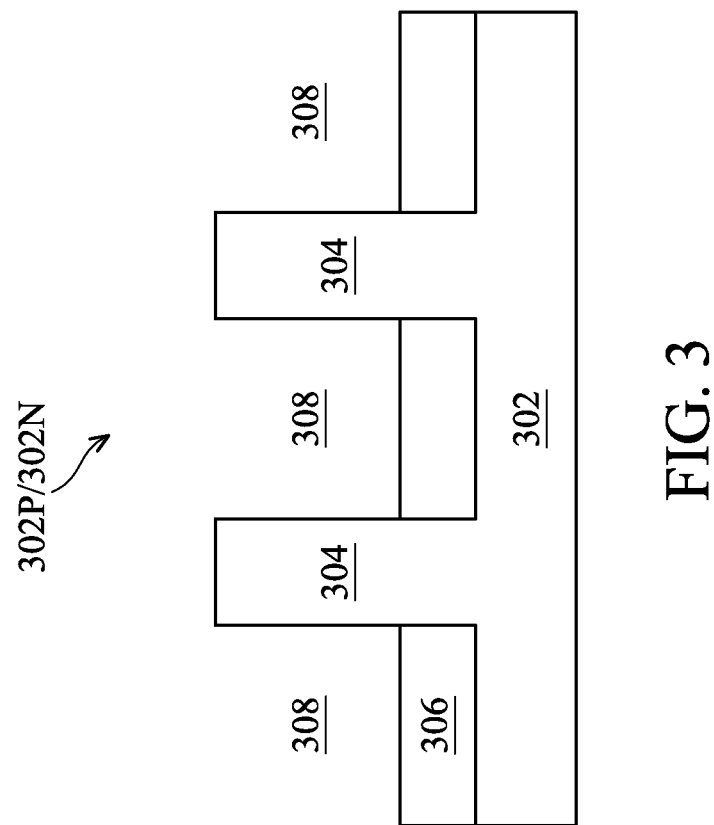

Referring to FIGS. 2A and 3, the method 200 at operation 202 provides a substrate 302 of the device 300. The substrate 302 may be a semiconductor substrate, such as a bulk semiconductor, a semiconductor-on-insulator (SOI) substrate, or the like, which may be doped (e.g., with a P-type or an N-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In the present embodiments, referring to FIG. 4, the substrate 302 includes a first region 302P and a second region 302N configured to provide a P-type device (e.g., a P-type FinFET device, a P-type GAA transistor device, a P-type vertical transistor device, etc.) and an N-type device (e.g., an N-type FinFET, an N-type GAA transistor device, an N-type vertical transistor device, etc.), respectively. In this regard, the first region 302P and the second region 302N may each be optionally doped with different dopants (or impurities) that complement the types of device for which they provide. For example, the first region 302P may include an N-type doped well (not depicted) and the second region 302N may include a P-type doped well (not depicted). The N-type doped well may include an N-type dopant, such as phosphorous (P), arsenic (As), the like, or combinations thereof. The P-type doped well may include a P-type dopant, such as boron (B), indium (In), the like, or combinations thereof. Embodiments depicted in FIGS. 3, 5, 13, and 15, which are taken along line B-B of FIG. 1, are representative of the structures of the device 300 in either the first region 302P or the second region 302N at various fabrication stages of the method 200 and/or the method 250. The first region 302P and the second region 302N may be disposed adjacent one another, though the present disclosure does not require such configuration. For purposes of illustration, the first region 302P and the second region 302N are depicted to be formed along line A-A, which is the longitudinal axis of a fin (e.g., the fin 304), in FIGS. 4, 9, 12, 14, 16, 19, 25, and 30.

Still referring to FIGS. 2A and 3, the method 200 at operation 204 forms a (semiconductor) fin 304 to protrude or extend vertically from the substrate 302 (e.g., from both the first region 302P and the second region 302N). The fin 304 may be more generically referred to as a semiconductor layer protruding from the substrate 302. Although two fins 304 are shown in the illustrated embodiment of FIG. 3 (and the subsequent figures), it should be appreciated that the device 300 can include any number of the fins 304 while remaining within the scope of the present disclosure. In some embodiments, the fins 304 are formed by patterning the substrate 302 using, for example, photolithography and etching techniques. For example, a mask layer (not depicted), including a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbo nitride, the like, or combinations thereof. The pad oxide layer and the pad nitride layer may each be formed using low-pressure chemical vapor deposition (LPCVD) or plasma enhanced-chemical vapor deposition (PECVD), for example.

The mask layer may be patterned using photolithography techniques. Generally, photolithography techniques utilize a photoresist material (not depicted) that is deposited, irradiated (or exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask, which is subsequently used to pattern exposed portions of the substrate 302 to form trenches 308, thereby defining the fins 304 separated by the trenches 308 as depicted in FIG. 3. When multiple fins are formed, such a trench 308 may be disposed between any two adjacent fins 304. In some embodiments, the fins 304 are formed by etching the trenches 308 in the substrate 302 using, for example, reactive ion etch (RIE), neutral beam etch (NBE), the like, or combinations thereof. The etching may be anisotropically implemented. In some embodiments, the trenches 308 may be strips (viewed from the top) parallel to each other, and closely spaced with respect to each other. In some embodiments, the trenches 308 may be continuous and surround each fin 304. In this regard, though not depicted herein, a top surface of the resulting fins 304 is overlaid with the patterned mask until a subsequent fabrication step removes it.

The fins 304 may be patterned by other suitable methods. In one example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not depicted) is formed over the substrate 302 and patterned using a photolithography process. Spacers (not depicted) are formed alongside the patterned sacrificial layer using a self-aligned process. The sacrificial layer is then removed, and the remaining spacers, or mandrels, may then be used to pattern the fins 304.

In another example, a top portion of the substrate 302 may be replaced by or overlaid with a suitable material, such as an epitaxial material (not depicted) suitable for an intended type (e.g., N-type or P-type) of semiconductor devices to be formed. The epitaxial material may be grown over the substrate 302 by any suitable epitaxial process. Thereafter, the substrate 302, with the epitaxial material provided over the top portion, is patterned by a photolithography process described herein, for example, to form the fins 304 that include the epitaxial material.

Still referring to FIGS. 2A and 3, the method 200 at operation 206 forms isolation regions 306 over the substrate 302 to surround bottom portions of the fins 304. The isolation regions 306, which are formed of a dielectric (or insulating) material, can electrically isolate neighboring fins 304 from one another. The dielectric material may include an oxide, such as silicon oxide (SiO and/or $SiO_2$), a nitride, the like, or combinations thereof, and may be formed by a high density plasma chemical vapor deposition (HDPCVD), a flowable CVD (FCVD) (e.g., a CVD-based material deposition in a remote plasma system, followed by an annealing or curing process to densify the deposited material into another material, such as an oxide), spin coating, the like, or combinations thereof. Other dielectric materials and/or other formation processes may be used to form the isolation regions 306. In the depicted embodiments, the dielectric material of the isolation regions 306 include silicon oxide formed by a FCVD process. An annealing process may be performed once the dielectric material is deposited. A planarization process, such as a chemical-mechanical polish/planarization (CMP) process, may remove any excess dielectric material, such that a top surface of the dielectric material and the top surface of the fins 304 that are substantially coplanar. The patterned mask over the top surface of the fins 304 may also be removed by the planarization process.

Subsequently, the dielectric material is recessed to form the isolation regions 306 in the trenches 308, as depicted in FIG. 3. In some embodiments, the isolation regions 306 include shallow trench isolation (STI) features. The isolation regions 306 are recessed such that the upper portions of the fin 304 protrude from between neighboring isolation regions 306. Respective top surfaces of the isolation regions 306 may have a flat surface (as depicted), a convex surface, a concave surface (such as dishing), or combinations thereof. The top surfaces of the isolation regions 306 may be formed such profile(s) by any suitable etching process, such as one that is selective to the material of the isolation regions 306 with respect to the substrate 302 (and the fins 304). For example, a dry etching process or a wet etching process using dilute hydrofluoric (DHF) acid may be performed to recess the dielectric material to form the isolation regions 306.

As another example of forming the fins 304 and the isolation regions 306, a dielectric layer (not depicted) may be formed over the top surface of the substrate 302; trenches may be etched through the dielectric layer; homoepitaxial structures may be epitaxially grown in the trenches; and the dielectric layer may be recessed such that the homoepitaxial structures protrude from the dielectric layer to form the fins 304. In yet another example, a dielectric layer (not depicted) may be formed over the top surface of the substrate 302; trenches may be etched through the dielectric layer; heteroepitaxial structures may be epitaxially grown in the trenches using a material different from the substrate 302; and the dielectric layer may be recessed such that the heteroepitaxial structures protrude from the dielectric layer to form the fins 304.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an N-type device region (e.g., a region configured to provide an N-type metal oxide-semiconductor, or NMOS, device) different from the material in a P-type device region (e.g., a region configured to provide a P-type MOS, or PMOS, device). In various embodiments, the fins 304 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
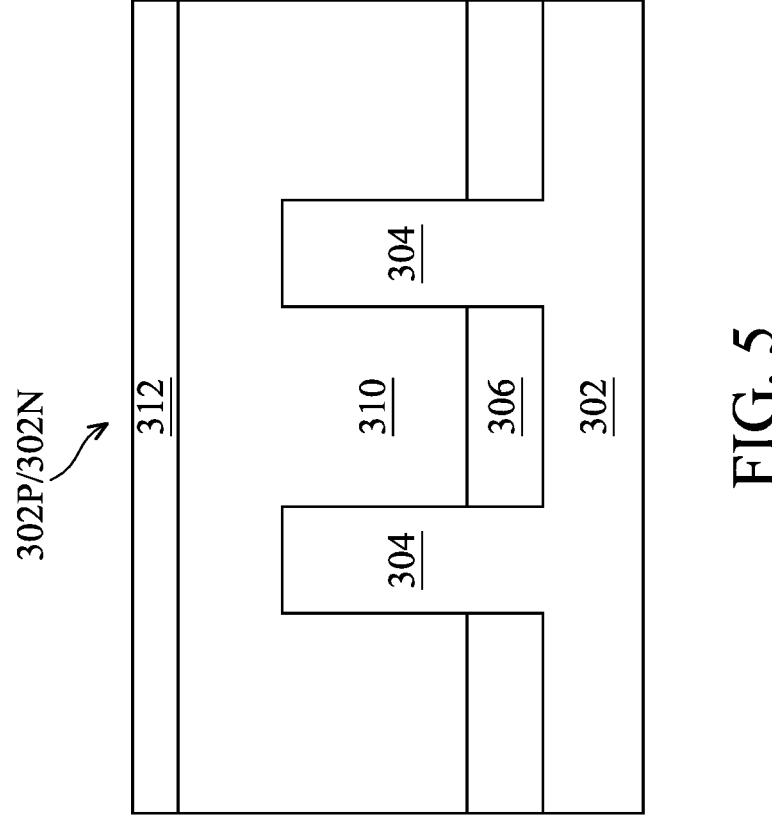

Referring to FIGS. 2A, 4, and 5, the method 200 at operation 208 forms a first dummy gate structure 310A over a channel region 311 of the fin 304 in the first region 302P and a second dummy gate structure 310B over a channel region 313 of the fin 304 in the second region 302N. In this regard, the first dummy gate structure 310A engages with the channel region 311 (disposed in an N-type doped well) to provide the P-type device, and the second dummy gate structure 310B engages with the channel region 313 (disposed in a P-type doped well) to provide the N-type device. For purposes of simplicity, the first dummy gate structure 310A and the second dummy gate structure 310B are collectively referred to as the dummy gate structure 310 for the following discussion. Furthermore, it should be appreciated that more or less than two dummy gate structures 310 can be formed over the fins 304 while remaining within the scope of the present disclosure.

The dummy gate structure 310 may include a dummy gate dielectric over the fins 304 and a dummy gate electrode over the dummy gate dielectric layer (not depicted separately), in some embodiments. The dummy gate structure 310 may optionally include an interfacial layer between the fins 304 and the dummy gate dielectric layer, where the interfacial layer may include an oxide, such as silicon oxide. The gate dielectric layer may include any suitable dielectric material, such as silicon oxide, silicon nitride, multilayers thereof, or the like. The dummy gate electrode may include polysilicon.

Various layers of the dummy gate structure 310 may be deposited as blanket layers over the fins 304 by any suitable process, such as CVD, atomic layer deposition (ALD), or physical vapor deposition (PVD), thermally grown, or chemically grown, and then planarized by a CMP process, for example. A mask layer including silicon nitride or the like may be deposited over the various blanket layers of the dummy gate structure 310. The mask layer may be patterned using a series of photolithography and etching processes to form the mask 312. The pattern of the mask 312 may then be transferred to the blanket layers using any suitable etching processes to form the dummy gate structure 310. The dummy gate structure 310 traverses or covers a portion, e.g., the channel regions 311 and 313, of the fin 304, where a lengthwise direction of the dummy gate structure 310 (e.g., along the line B-B of FIG. 1) is substantially perpendicular to a lengthwise direction of the fins 304 (e.g., the line A-A of FIG. 1).

Referring to FIGS. 2A and 4, the method 200 subsequently forms a number of lightly doped drain (LDD) regions 314 in the first region 302P and LDD regions 316 in the second region 302N. The LDD regions 314 and 316 may be formed by applying a plasma doping process to portions of the fin 304 in the respective device regions. The plasma doping process may include forming a patterned mask (not depicted), such as a patterned photoresist, to cover the regions of the device 300 that are to be protected from the plasma doping process. The plasma doping process may implant P-type dopants in the fin 304 to form the LDD regions 314 in the first region 302P and implant N-type dopants in the fin 304 to form the LDD regions 316 in the second region 302N. Non-limiting examples of the P-type dopants and N-type dopants are discussed above. In some embodiments, the LDD regions 314 and 316 each abut one of the channel regions 311 and 313 of the device 300, respectively. Portions of the LDD regions 314 and 316 may extend under the first dummy gate structure 310A and the second dummy gate structure 310B, respectively, and into the channel regions 311 and 313 of the device 300, respectively. FIG. 5 depicts a non-limiting example of the LDD regions 314 and 316. Other configurations, shapes, and formation methods of the LDD regions 314 and 316 may also be possible and are fully intended to be included within the scope of the present disclosure. For example, the LDD regions 314 and 316 may be formed after gate spacers 320/322, which will be discussed below, are formed. In some embodiments, the LDD regions 314 and 316 are omitted from the device 300.

Still referring to FIG. 4, after forming the LDD regions 314 and 316, first gate spacers 320 are formed around (e.g., along and contacting the sidewalls of) the dummy gate structures 310, and second gate spacers 322 are formed around (e.g., along and contacting the sidewalls of) the first gate spacers 320. For example, the first gate spacers 320 may be formed on opposing sidewalls of the dummy gate structure 310, and the second gate spacers 322 may be formed on the first gate spacers 320. It should be understood that any number of gate spacers can be formed around the dummy gate structures 310 while remaining within the scope of the present disclosure.

The first gate spacers 320 may be a low-k (e.g., having a dielectric constant less than that of silicon oxide, which is about 3.9) spacer and may include a suitable dielectric material, such as silicon oxide, silicon oxycarbonitride, the like, or combinations thereof. The second gate spacers 322 may include a suitable dielectric material, such as silicon nitride, silicon oxynitride, silicon carbonitride, the like, or combinations thereof. In accordance with various embodiments, the first gate spacers 320 and the second gate spacers 322 include different materials to provide etching selectivity therebetween in subsequent processing. The first gate spacers 320 and the second gate spacers 322 may be formed by first conformally depositing a dielectric layer over the dummy gate structures 310 using any suitable deposition process, such as thermal oxidation, CVD, or the like, and subsequently removing portions of the dielectric layer using a suitable etching process (e.g., a directional or anisotropic dry etching process), leaving behind the first gate spacer 320 and the second gate spacer 322 along the sidewalls of the dummy gate structures 310. The first gate spacer 320 and the second gate spacer 322 may sometimes be collectively referred to as gate spacers 320/322.

The shapes and formation methods of forming the gate spacers 320/322 as illustrated in FIG. 4 (and the subsequent figures) are merely non-limiting examples, and other shapes and formation methods are possible. These and other variations are fully intended to be included within the scope of the present disclosure.

Still referring to FIGS. 2A, 4, and 6-8, the method 200 at operation 210 forms first source/drain features 330 in the first region 302P and second source/drain feature 332 in the second region 302N. In the present embodiments, the first source/drain features 330 include silicon germanium (SiGe) doped with a P-type dopant, such as B, In, the like, or combinations thereof, and the second source/drain features 332 include silicon (Si) doped with an N-type dopant, such as P, As, the like, or combinations thereof. In some embodiments, the second source/drain features 332 include silicon carbon (SiC) doped with an N-type dopant provided herein.

The first source/drain features 330 and the second source/drain features 332 may be formed by first etching the fins 304 to form recesses (not depicted) adjacent to each dummy gate structure 310 by any suitable etching process, such as a dry etching process. For example, the recesses may be formed by an anisotropic dry etching process using the dummy gate structures 310 as an etching mask. Then, the first source/drain features 330 and the second source/drain features 332 are formed in the recesses by epitaxially growing a semiconductor material (e.g., Si, SiC, or SiGe) from the fins 304 exposed in the recesses, using any suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof. The resulting first source/drain features 330 and the second source/drain features 332 are alternately arranged with their corresponding dummy gate structures 310, where each dummy gate structure 310 is interposed between a pair of adjacent first source/drain features 330 and second source/drain features 332 along the lengthwise direction of each fin 304 (e.g., the line A-A as depicted in FIG. 1).

The first source/drain features 330 and the second source/drain features 332 may be implanted with one or more suitable dopants using a process that may include forming and patterning masks, such as a photoresist, to cover regions (e.g., the first region 302P or the second region 302N) of the device 300 that are to be protected from the implanting process. After performing the implanting process, the patterned masks are removed from the device 300 by any suitable method, such as plasma ashing or resist stripping. Subsequently, different patterned masks may be formed to expose different regions before performing additional implanting processes, followed by the removal of the patterned masks.

The first source/drain features 330 and the second source/drain features 332 may have a dopant (e.g., impurity) concentration in a range of about $1\times10^{19}$ cm$^{-3}$ to about $1\times10^{21}$ cm$^{-3}$. P-type dopants, such as B or In, may be implanted in the first source/drain features 330, and N-type dopants, such as P or As, may be implanted in the second source/drain features 332. In some embodiments, the implanting process may be tuned to introduce different dopant concentrations at different depth of each of the first source/drain features 330 and the second source/drain features 332. In some embodiments, the first source/drain features 330 and the second source/drain features 332 may be doped in situ while epitaxially growing the semiconductor materials in the recesses. An annealing process may be applied after doping the semiconductor materials to activate the impurities.

Figure 6:
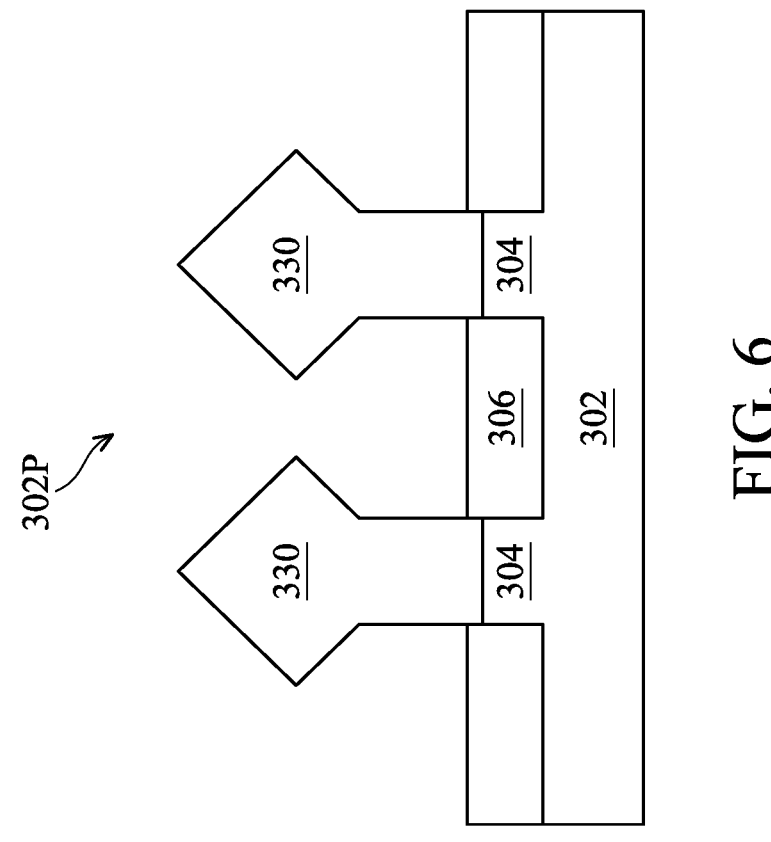
Figure 7:
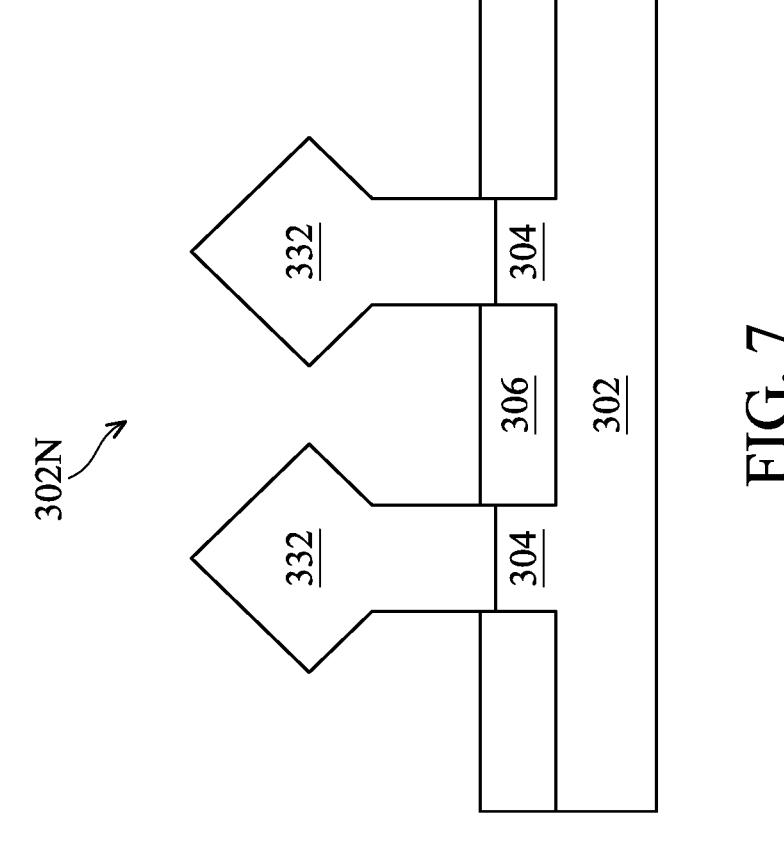
Figure 8:
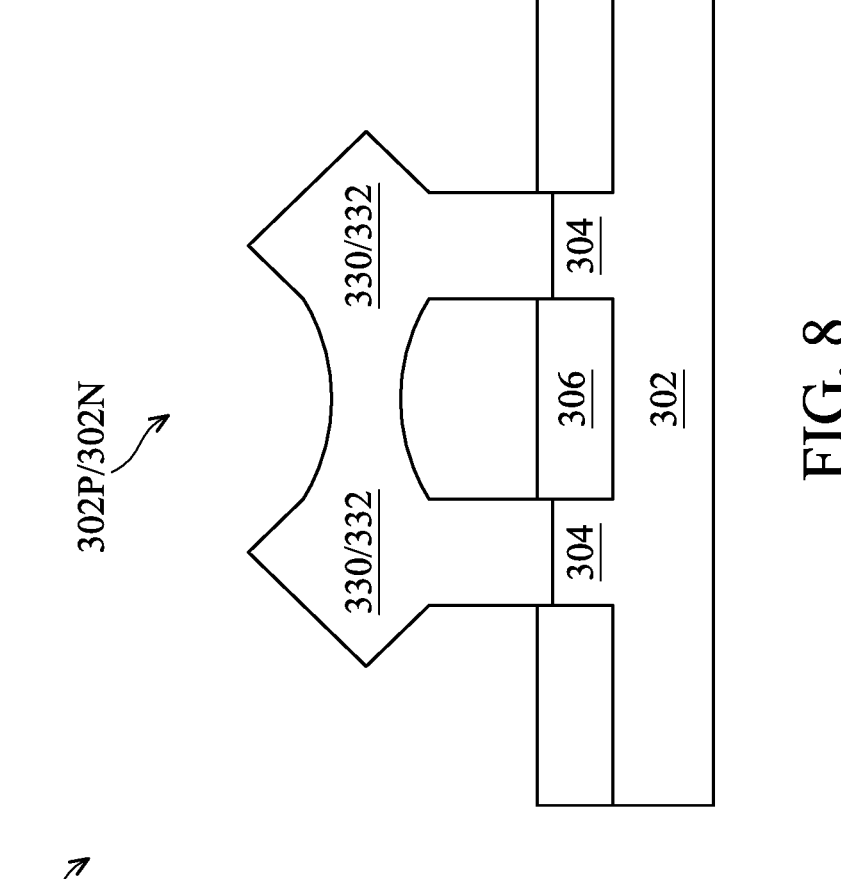

As depicted in FIG. 6-8, the first source/drain features 330 and the second source/drain features 332 may have top surfaces raised from surfaces of the fin 304 (e.g. raised above the non-recessed portions of the fin 304) and may have facets oriented along different crystallographic planes. In some embodiments, referring to FIGS. 6-8, the first source/drain features 330 and the second source/drain features 332 extend to below a top surface of the isolation regions 306. In some embodiments, referring to FIGS. 6 and 7, the first source/drain features 330 and the second source/drain features 332 of the adjacent fins 304 may be separated from one another. In some embodiments, referring to FIG. 8, the first source/drain features 330 and the second source/drain features 332 of the adjacent fins 304 may merge to form a continuous epitaxial source/drain feature. FIGS. 6-8 provide non-limiting examples of the shapes of the first source/drain features 330 and the second source/drain features 332. For example, the first source/drain features 330 and the second source/drain features 332 may be configured as cladding source/drain features that are epitaxially grown from upper portions of the fins 304 without recessing the fins 304. Furthermore, shapes of the first source/drain features 330 and the second source/drain features 332 may be the same or different (see FIGS. 33A-33D).

Referring to FIGS. 2A and 9-15, the method 200 at operation 211 replaces the dummy gate structures 310 (e.g., the first dummy gate structure 310A and the second dummy gate structure 310B) with metal gate structures 360 (e.g., first metal gate structure 360A and second metal gate structure 360B, respectively). An example replacement gate process (sometimes referred to as a gate-last process) is performed to replace each of the dummy gate structures 310 with the metal gate structures 360, which may also be referred to as replacement gate structures or active gate structures.

Figure 9:
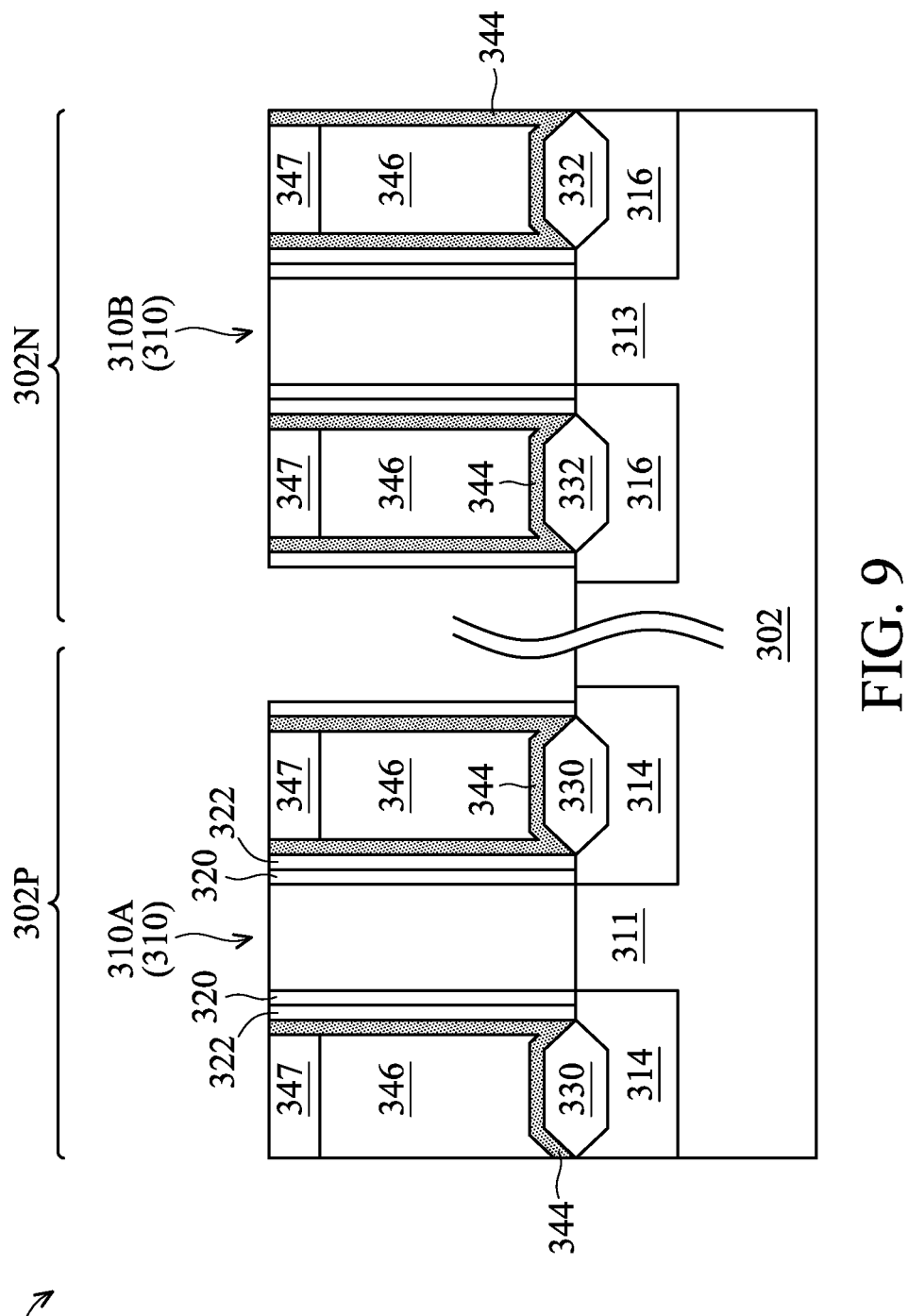

Referring to FIGS. 9-11, the method 200 forms an interlayer dielectric (ILD) layer 346 over the first source/drain features 330 and the second source/drain features 332 and adjacent the dummy gate structures 310. In some embodiments, prior to forming the ILD layer 346, a contact etch stop layer (CESL) 344 is formed over the device 300. The ILD layer 346 and CESL 344 include different materials to provide etching selectivity therebetween in subsequent fabrication processes. The CESL 344 may include any suitable dielectric material such as silicon nitride, silicon oxynitride, silicon oxide, the like, or combinations thereof, and may be formed by a suitable formation method such as CVD, ALD, PVD, the like, or combinations thereof.

Next, the ILD layer 346 is formed over the CESL 344 and over the dummy gate structures 310. In some embodiments, the ILD layer 346 includes any suitable dielectric material, such as silicon oxide, a low-k dielectric material, phosphosilicate glass (PSG), borosilicate glass (BSG), boron-doped phosphosilicate glass (BPSG), undoped silicate glass (USG), the like, or combinations thereof, and may be deposited by any suitable method, such as CVD, PECVD, FCVD, or the like. After the ILD layer 346 is formed, a dielectric layer 347 is formed over the ILD layer 346. The dielectric layer 347 may function as a protection layer to prevent or reduce the loss of the ILD layer 346 in subsequent etching processes. In this regard, the dielectric layer 347 and the ILD layer 346 may include different compositions to enhance the etching selectivity therebetween. The dielectric layer 347 may be formed of a suitable material, such as silicon nitride, silicon carbonitride, the like, or combinations thereof using a suitable method such as CVD, PECVD, FCVD, or the like. After the dielectric layer 347 is formed, a planarization process, such as a CMP process, may be performed to achieve a leveled top surface for the dielectric layer 347. The CMP process may also remove the mask 312 and portions of the CESL 344 disposed over the dummy gate structures 310. After the planarization process, the top surface of the dielectric layer 347 is substantially coplanar with the top surface of the dummy gate structures 310 as depicted herein. In some embodiments, the dielectric layer 347 is omitted, such that the ILD layer 346, after being planarized, is substantially coplanar with the top surface of the dummy gate structures 310.

Figure 12:
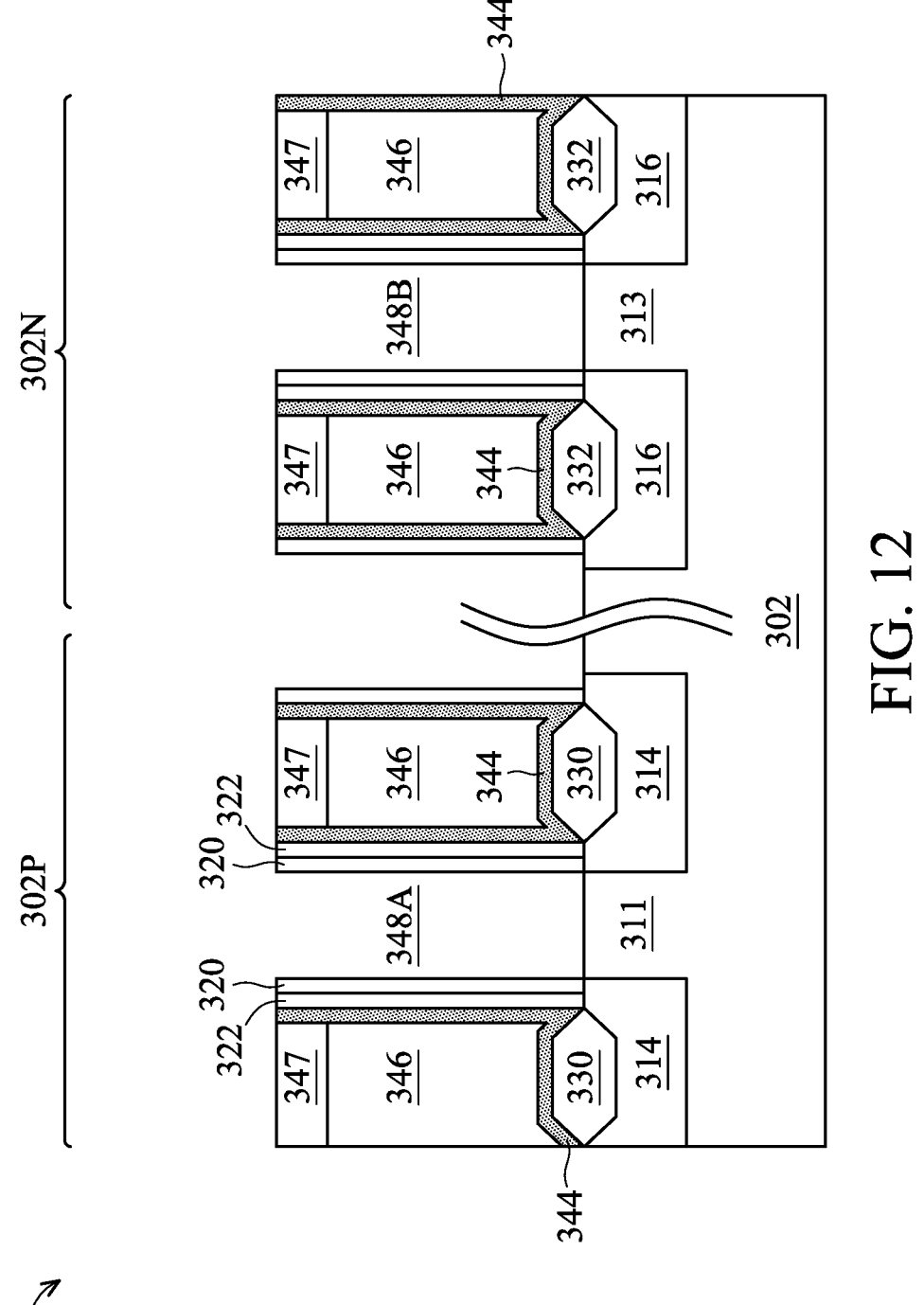

Referring to FIGS. 12 and 13, the method 200 removes the first dummy gate structure 310A and the second dummy gate structure 310B to form a first gate trench 348A and a second gate trench 348B, respectively, which may collectively be referred to as the gate trenches 348 for purposes of simplicity. In some embodiments, the dummy gate structures 310 are removed by one or more etching steps between the respective first gate spacers 320 to expose the channel regions 311 and 313 of the fin 304. In some embodiments, the dummy gate dielectric layer (not depicted) may be used as an etch stop layer when the dummy gate electrode is etched. The dummy gate dielectric layer may then be removed after the removal of the dummy gate electrode. In some examples, top portions of the first gate spacers 320, the second gate spacers 322, or both may be removed (or shortened) by a suitable etching process to expose top portions of the ILD layer 346.

Figure 14:
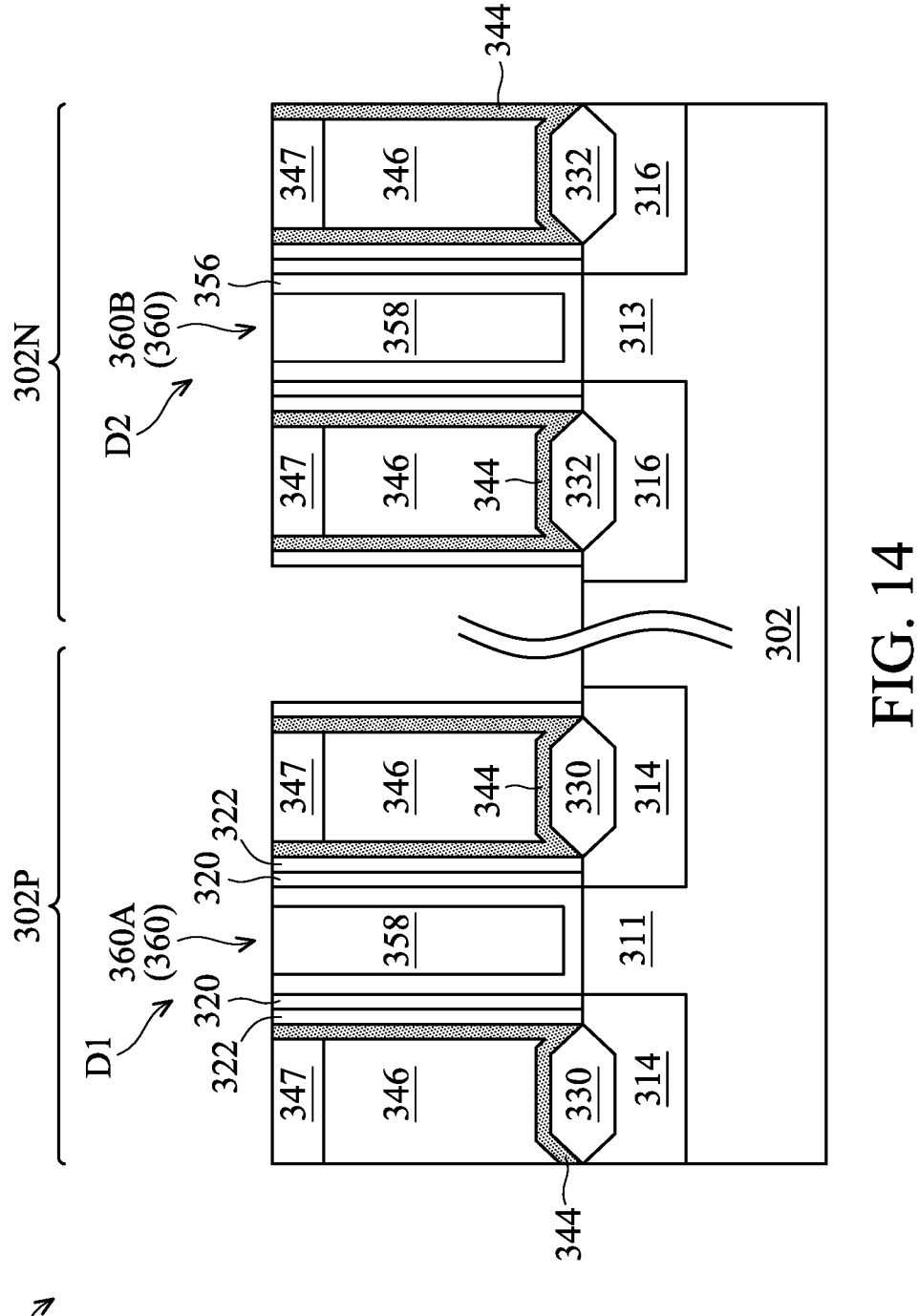
Figure 15:
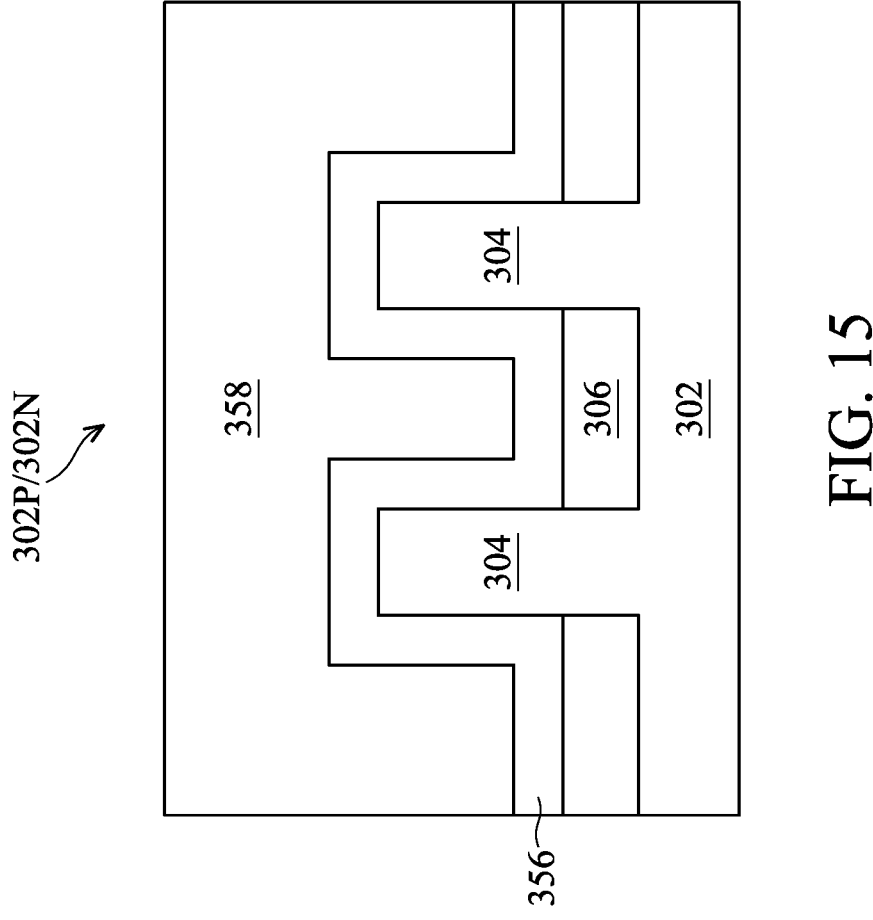
Figure 16:
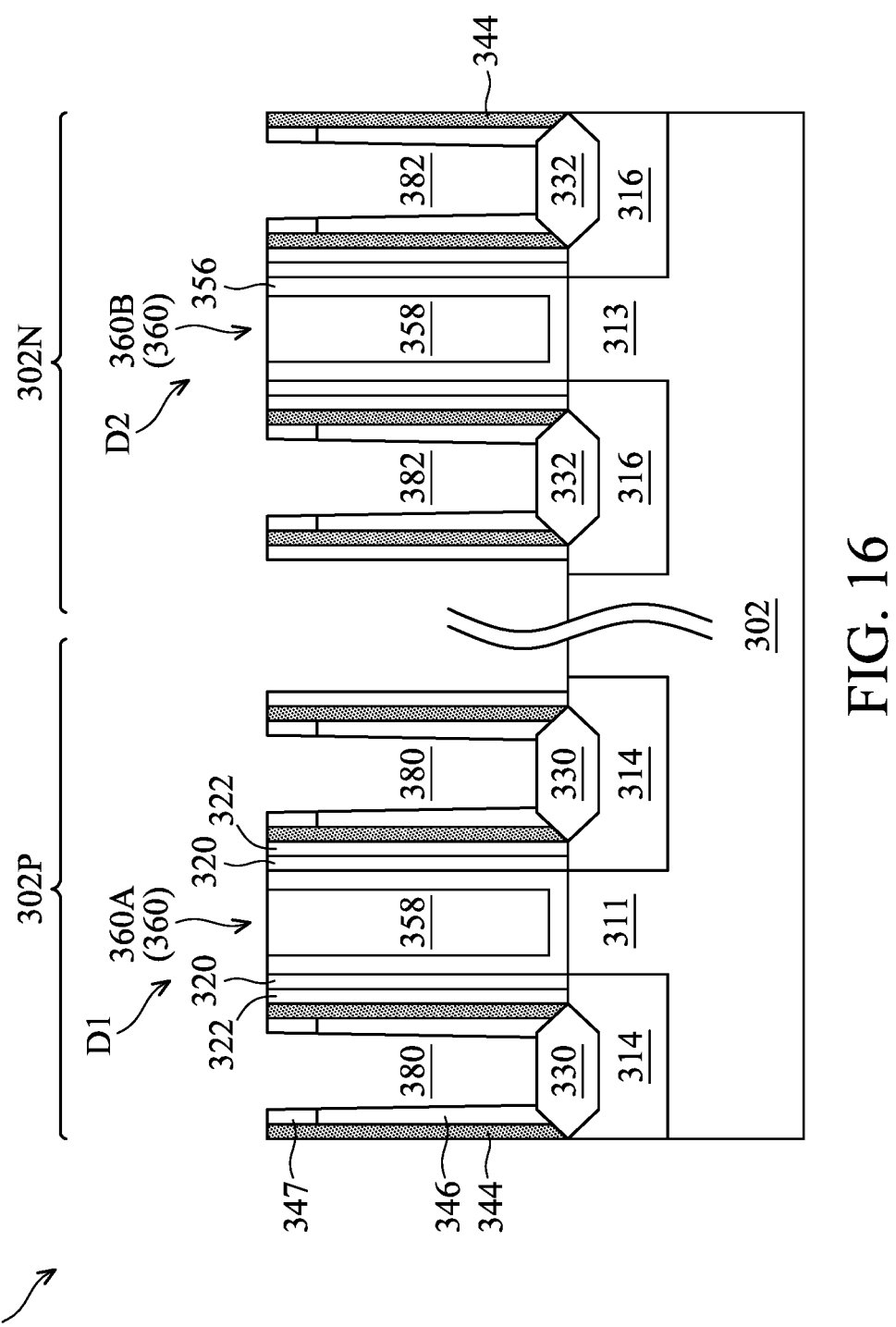
Figure 19:
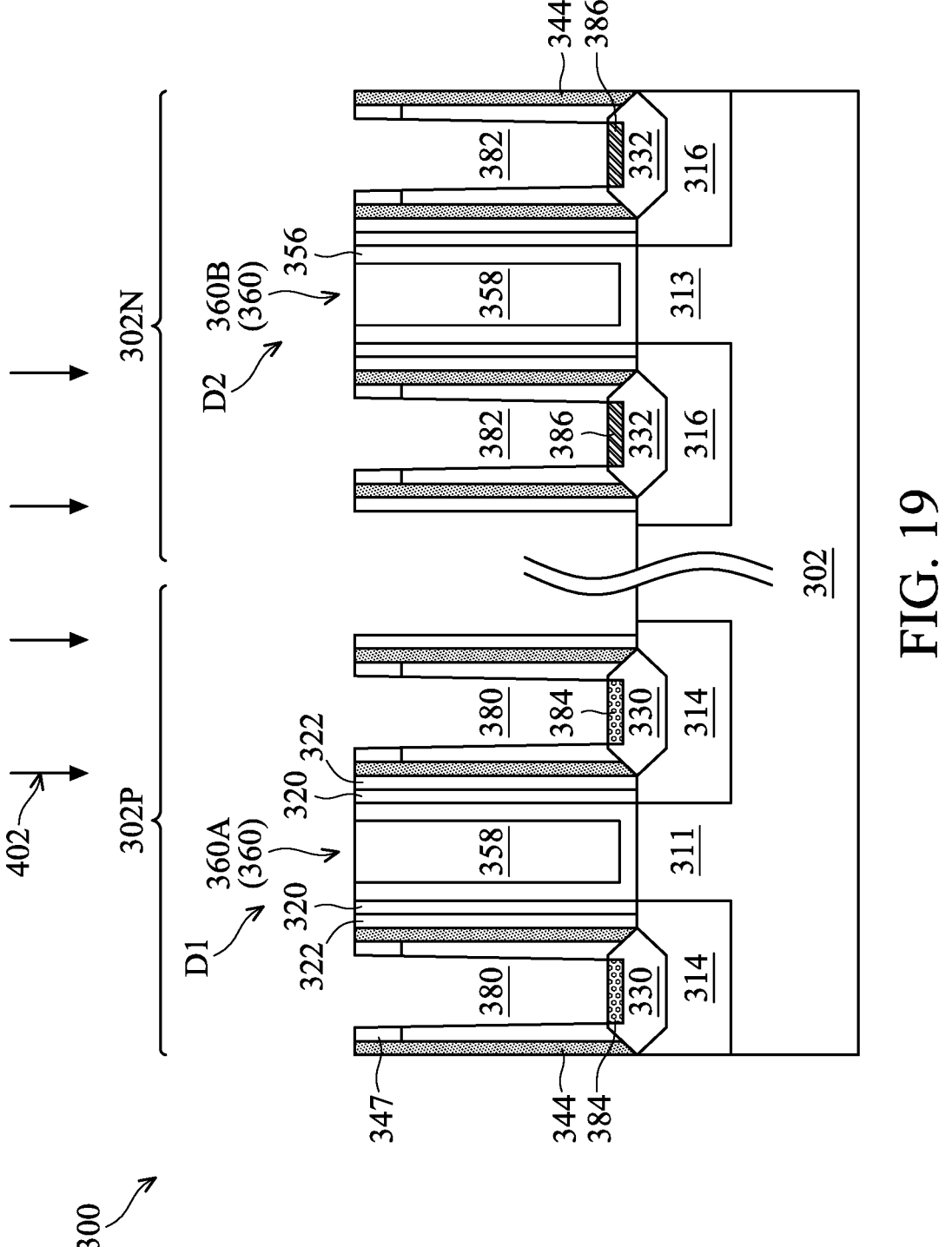

Referring to FIGS. 14 and 15, the method 200 forms the first metal gate structure 360A and the second metal gate structure 360B in the first gate trench 348A and the second gate trench 348B, respectively. The first metal gate structure 360A engages with the first source/drain features 330 to form a first device D1 and the second metal gate structure 360B engages with the second source/drain features 332 to form a second device D2, where the device D1 is a P-type device and the device D2 is an N-type device. In some embodiments, the first device D1 and the second device D2 may couple to form a complementary MOS (CMOS) device.

In some embodiments, forming the metal gate structures 360 includes conformally depositing a gate dielectric layer 356 in the gate trenches 348 to traverse the channel regions 311 and 313 and the first gate spacers 320. The gate dielectric layer 356 may include any suitable dielectric material, such as silicon oxide, silicon nitride, a high-k dielectric material (i.e., having a dielectric constant greater than that of silicon oxide, which is about 3.9), the like, or combinations thereof. The high-k dielectric material may include an oxide or a silicate of Hf, Al, Zr, La, Mg, Ba, Ti, Pb, the like, or combinations thereof. The gate dielectric layer 356 may be formed by any suitable method, such as ALD, CVD, PECVD, molecular beam deposition (MBD), the like, or combinations thereof. In some embodiments, an interfacial layer (not depicted) may be formed over the channel regions 311 and 313 in the gate trenches 348 before forming the gate dielectric layer 356. The interfacial layer may include an oxide, such as silicon oxide, and may be formed by any suitable method, such as ALD, CVD, thermal oxidation, chemical oxidation, the like, or combinations thereof.

Subsequently, the method 200 at operation 222 forms a gate electrode 358 over the gate dielectric layer 356, resulting in the metal gate structures 360 in the corresponding gate trenches 348. The gate electrode 358 may include any suitable metal, such as tungsten (W), copper (Cu), ruthenium (Ru), aluminum (Al), gold (Au), cobalt (Co). The gate electrode 358 may be formed by any suitable method, such as PVD, CVD, electroplating, electroless plating, the like, or combinations thereof, as a blanket layer over the gate dielectric layer 356 and subsequently planarized by a CMP process, for example, to expose a top surface of the first gate spacers 320 and the second gate spacers 322. While not depicted the gate electrode 358 may further include a barrier layer, a seed layer, the like, or combinations thereof. In one example, the barrier layer may include Ti, Ta, TiN, TaN, the like, or combinations thereof, and may be deposited by any suitable method, such as CVD or ALD.

In some embodiments, though not depicted, one or more work function layers may be formed conformally over the gate dielectric layer 356 before forming the gate electrode 358. The work function layers may include a P-type work function layer, an N-type work function layer, multi-layers thereof, or combinations thereof. In the discussion herein, a work function layer may also be referred to as a work function metal. Examples of the work function layers may include TiN, TaN, Ru, Mo, Al, $ZrSi_2$, $MoSi_2$, $TaSi_2$, $NiSi_2$, WN, Ti, Ag, TaAl, TaAlC, TiAlN, TaC, TaCN, TaSiN, Mn, Zr, the like, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, PVD, ALD, the like, or combinations thereof. Additional layers (not depicted) including a capping layer, a glue layer (or an adhesion layer), the like, or combinations thereof may also be formed between the gate dielectric layer 356 and the gate electrode 358 by any suitable method, such as CVD, PVD, ALD, MBD, the like, or combinations thereof. In some embodiments, the capping layer may include silicon, silicon oxide, silicon nitride, the like or combinations thereof. The glue layer may each include Ti, Ta, TiN, TaN, the like, or combinations thereof. In some embodiments, the work function layer(s), the capping layer, the glue layer, and/or the like may each be formed to have a U-shaped configuration over the gate dielectric layer 356, which is also formed to have a U-shaped configuration.

Referring to FIGS. 2A and 16-29 collectively, the method 200 at operation 212 forms a first silicide layer 388 over the first source/drain features 330 and a second silicide layer 390 over the second source/drain features 332. In the present embodiments, referring to FIG. 2B, operation 212 is implemented by the method 250.

Referring to FIGS. 2B and 16-18, the method 250 at operation 252 forms a first contact opening 380 to expose the first source/drain features 330 and a second contact opening 382 to expose the second source/drain features 332.

Forming the first contact opening 380 and the second contact opening 382 includes forming a patterned mask (e.g., a patterned photoresist) over the dielectric layer 347 and sequentially etching through the dielectric layer 347, the ILD layer 346, and the CESL 344 using the patterned mask as an etch mask. After patterning the ILD layer 346 and the dielectric layer 347, the patterned mask is removed by any suitable method, such as plasma ashing or resist stripping. In some embodiments, forming the first contact opening 380 and the second contact opening 382 removes top portions of the first source/drain features 330 and the second source/ drain features 332, respectively, as shown in FIGS. 17 and 18.

Referring to FIGS. 2B and 19-21, the method 250 at operation 254 deposits a metal halide 402 in the first contact opening 380 and the second contact opening 382. In the present embodiments, the metal halide 402 reacts with the first source/drain features 330 to form a first metal layer 384 and with the second source/drain features 332 to form a second metal layer 386. As the first source/drain features 330 include SiGe doped with a P-type dopant (e.g., B) and the second source/drain features 332 include Si doped with an N-type dopant (e.g., P), the composition of the first metal layer 384 differs from that of the second metal layer 386. A portion 300A of the device 300 containing the first metal layer 384 in the first region 302P is illustrated in detail in FIG. 22A and a portion 300B of the device 300 containing the second metal layer 386 in the second region 302N is illustrate in detail in FIG. 22B.

In the present embodiments, the metal halide 402 includes a first metal M1 having a work function similar to that of SiGe, ranging from about 4.5 eV to about 5 eV. In this regard, the first metal M1 may be referred to as a P-type metal in the present disclosure. Non-limiting examples of the first metal M1 include molybdenum (Mo), ruthenium (Ru), nickel (Ni), cobalt (Co), platinum (Pt), tungsten (W), and the like. The metal halide 402 further includes a halogen selected from chlorine (Cl), fluorine (F), bromine (Br), iodine (I), and the like.

In the present embodiments, the metal halide 402 includes molybdenum chloride ($MoCl_5$). As shown in Schemes I and II below, $MoCl_5$ can react with both Si (Scheme I) and Ge (Scheme II), though the changes in enthalpy (or change in thermodynamic energy; $\Delta H$) of the two reactions are different. For example, $\Delta H$ for Scheme I is about −12.288 eV (or about −1186 kJ/mol) and $\Delta H$ for Scheme II is about −4.262 eV (or about −411 KJ/mol), a gap of about −8.026 eV between the two reactions. Such a gap in $\Delta H$ suggests that $MoCl_5$ selectively or preferentially reacts with Si over Ge where both elements are present, i.e., in the first source/drain features 330.

$$5Si+4MoCl_5 \rightarrow 5SiCl_4+4Mo \qquad (I)$$

$$5Ge+4MoCl_5 \rightarrow 5GeCl_4+4Mo \qquad (II)$$

Figures 22A, 22B:
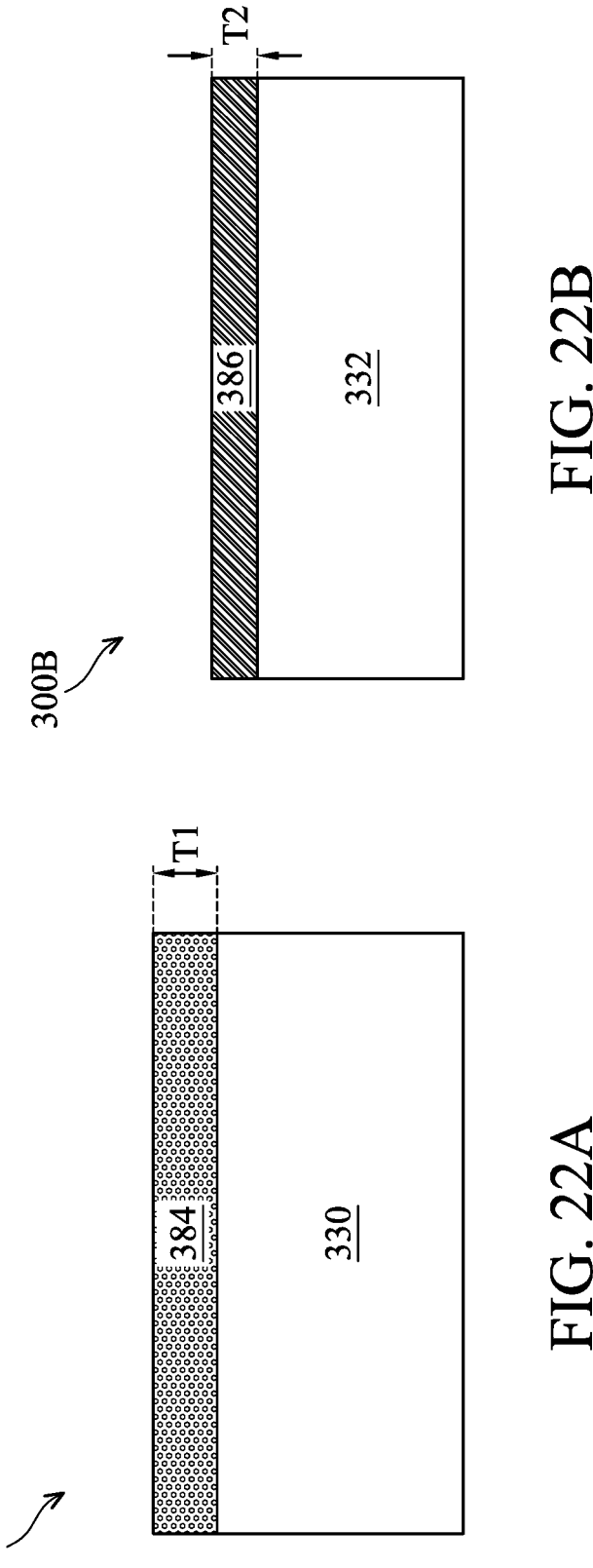
Figure 23:
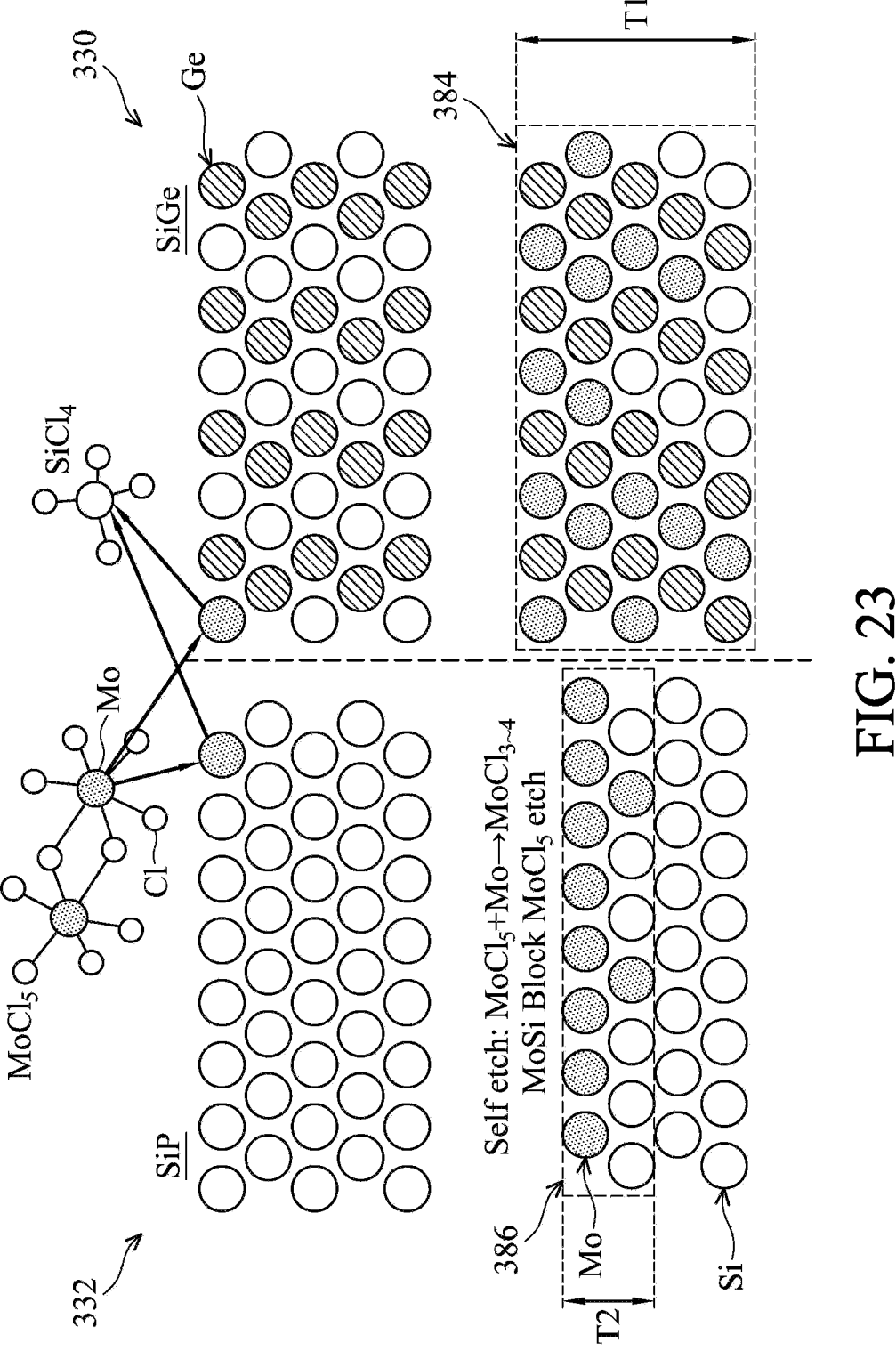
FIG. 23 illustrates a schematic representation of a chemical reaction involving a metal halide and a P-type source/ drain feature and an N-type source/drain feature, in accordance with some embodiments of the present disclosure.

Details of Schemes I and II are further illustrated in FIG. 23. With respect to the first source/drain features 330, which includes SiGe, some of the Si atoms in the topmost portion are replaced by Mo atoms, while most or all of the Ge atoms and some of the Si atoms remain substantially intact, resulting in the first metal layer 384 to include MoSiGe as depicted. Such a reaction allows the Mo atoms to gradually penetrate and selectively replace some of the Si atoms without substantially affecting the distribution of the Ge atoms. In this regard, a thickness T1 depicted in FIGS. 22A and 23 spans a distance over which the Mo atoms penetrate into the first source/drain features 330.

Plot 600 of FIG. 24 illustrates changes in atomic concentration as a function of distance from the top surface of the first metal layer 384. As shown, the concentrations of Ge and Mo, evidenced by profiles 610 and 620, respectively, each remain substantially uniform across the first metal layer 384, while the concentration of Si, evidenced by profile 630, gradually increases across the same region. Specifically, the concentration of Si in a top portion 384A of the first metal layer 384 is lower than the concentrations of Ge and Mo, respectively, while the concentration of Si in a bottom portion 384B of the first metal layer 384 gradually increases toward the first source/drain features 330 to a level similar to that of Ge and exceeding that of Mo. Furthermore, across an interface between the first metal layer 384 and the first source/drain features 330, the concentration of Ge begins to increase substantially, while the concentration of Si continues to increase steadily. The concentrations of Ge and Si each reach a pre-determined level in a bulk portion of the first source/drain features 330. It is noted that, although other elements (e.g., oxygen (O) and Cl evidenced by profiles 640 and 650, respectively) are present in the first metal layer 384, they account for minor reactants and/or reaction byproducts and are therefore not discussed in detail herein.

With respect to the second source/drain features 332, at least some of the Si atoms in the topmost portion are replaced by Mo atoms according to Scheme I to form the second metal layer 386 including MoSi. Such reaction also forms $SiCl_4$ as a byproduct, which may be purged during the deposition process. However, as illustrated by Scheme III below, the resulting Mo atoms continue to react with $MoCl_5$ in a self-etching process to form $MoCl_{3-4}$, which limits the subsequent formation of Mo atoms according to Scheme I.

$$MoCl_5 + Mo \rightarrow MoCl_{3-4} \qquad (III)$$

In this regard, MoSi of the second metal layer 386 limits $MoCl_5$ from penetrating the second source/drain features 332 and replacing additional Si atoms, resulting in MoSi to remain over a top surface of the second source/drain features 332 as the second metal layer 386. As such, a thickness T2 of the second metal layer 386, depicted in FIGS. 22B and 23, is less than the thickness T1 and may only include a few atomic layers. In some examples, the thicknesses T1 and T2 may each range from about 0.5 nm to about 5 nm. In some embodiments, a cleaning process is optionally performed to remove the second metal layer 386 from the second source/drain features 332. The cleaning process may be implemented using an etchant including Cl, F, or the like, to remove the second metal layer 386.

The metal halide 402 may be deposited by any suitable process, such as an ALD process, a cyclic CVD process, or the like. In some embodiments, the metal halide 402 reacts with top portions of the first source/drain features 330 and the second source/drain features 332 one atomic layer at a time to form the first metal layer 384 and the second metal layer 386, respectively. In some examples, the metal halide 402 may be deposited at a temperature of about 150° C. to about 400° C., with pressure (in the deposition chamber) of a about 1 Torr to about 300 Torr. For embodiments in which the metal halide 402 is deposited in a cyclic CVD process, a number of cycles may range from 2 to 200 at a duration of about 0.5 second to about 50 second per cycle. Other deposition conditions may also be applicable to embodiments of the present disclosure.

Subsequently, referring to FIGS. 2B and 25-27, the method 250 at operation 256 deposits a metal precursor 404 over the device 300 to form a first silicide layer 388 over the first source/drain features 330 and a second silicide layer 390 over the second source/drain features 332. In the present embodiments, the metal precursor 404 reacts with the first metal layer 384 to form an interfacial layer (also referred to as a dipole layer or a third silicide layer) 387. The interfacial layer 387, which directly contacts the top surface of the first source/drain features 330, has a composition different from that of the second silicide layer 390, which directly contacts the top surface of the second source/drain features 332. The portion 300A of the device 300 containing the first silicide layer 388 and the interfacial layer 387 in the first region 302P is illustrated in detail in FIG. 28A and the portion 300B of the device 300 containing the second silicide layer 390 in the second region 302N is illustrate in detail in FIG. 28B.

In the present embodiments, the metal precursor 404 includes a second metal M2 having a work function similar to that of Si and ranging from about 4.0 eV to about 4.5 eV, which is less than the work function of the first metal M1 included in the metal halide 402. In this regard, the second metal M2 may be referred to as an N-type metal in the present embodiments. Non-limiting examples of the second metal M2 include titanium (Ti), tantalum (Ta), aluminum (Al), and the like. In some examples, the metal precursor 404 may include a metal halide having the second metal M2 and may be applied with other reactive gases, such as hydrogen ($H_2$). The metal precursor 404 may be deposited by any suitable process, such as a CVD process, a PECVD process, or the like. The metal precursor 404 may be applied with a plasma at a temperature of about 400° C. to about 450° C., for example.

Figure 25:
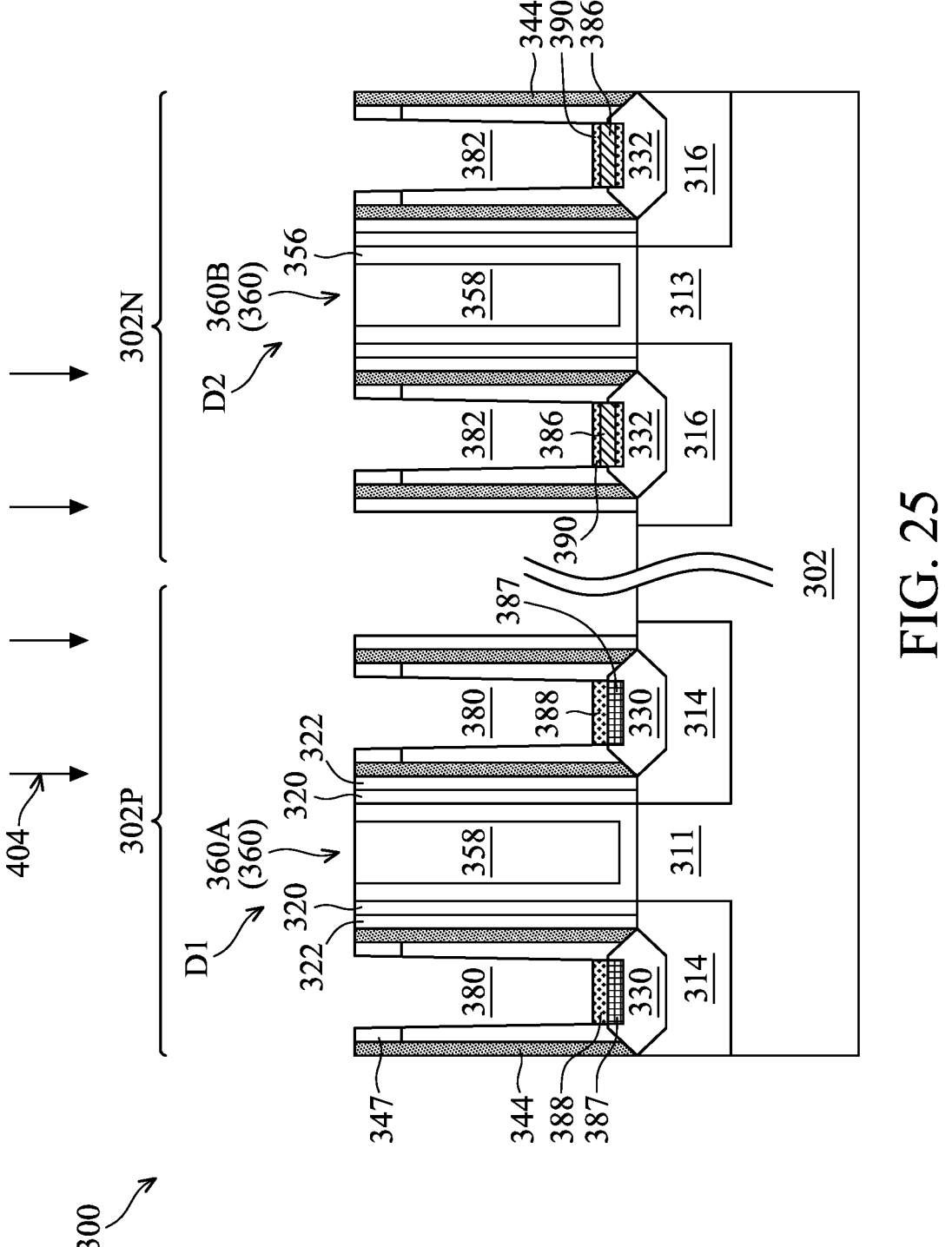
Figure 27:
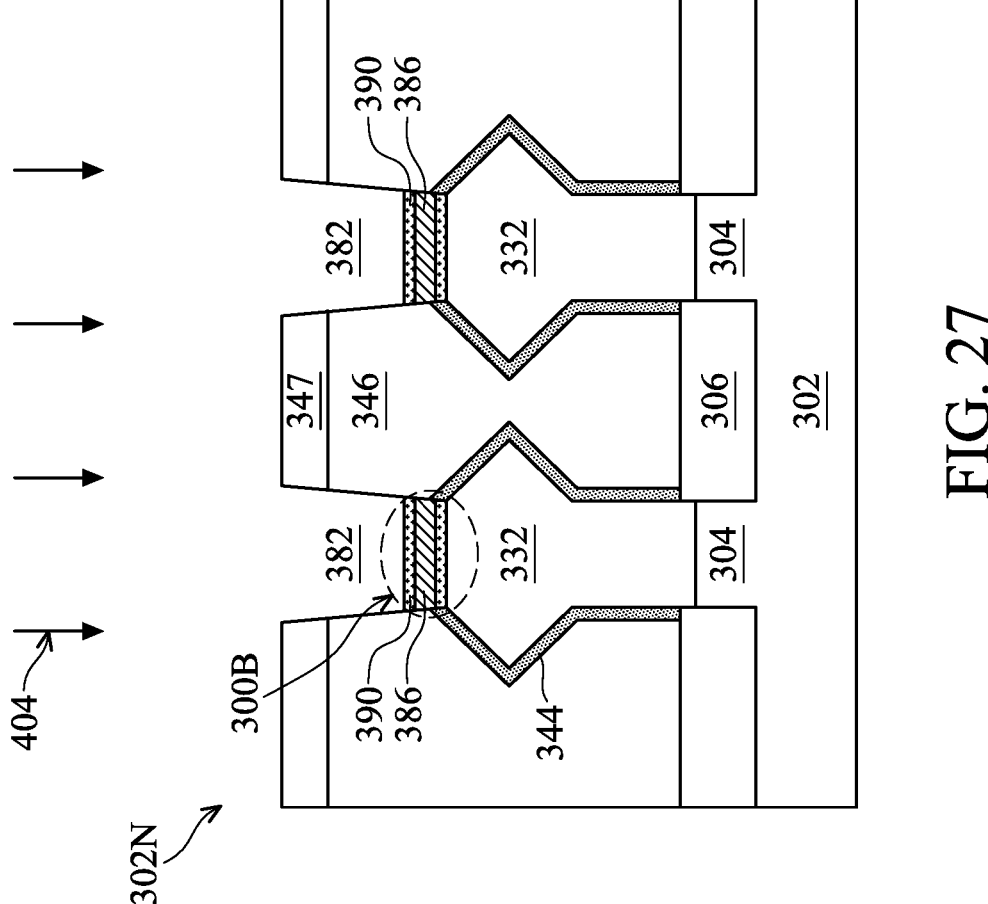

By way of example, the metal precursor 404 in the present embodiments includes $TiCl_4$, where the second metal M2 is Ti. In the present embodiments, $TiCl_4$ reacts with portions of the device 300 exposed in the first contact opening 380 and the second contact opening 382 to form the first silicide layer 388 and the second silicide layer 390, respectively, which both include titanium silicide (TiSi). As depicted herein, the first silicide layer 388 and a top portion of the second silicide layer 390 are each the topmost layer exposed in the first contact opening 380 and the second contact opening 382, respectively. In some embodiments, the metal precursor 404 penetrates the second metal layer 386 (due to its thinness, for example) to form a bottom portion of the second silicide layer 390 in direct contact with the top surface of the second source/drain features 332. The second silicide layer 390 may continue to grow and surround the second metal layer 386, as depicted in FIGS. 25, 27, and 28B. In this regard, the bottom portion of the second silicide layer 390 may be free of any Mo (e.g., the first metal M1) and consists of only TiSi (e.g., the silicide of the second metal M2). For embodiments in which the second metal layer 386 is removed by the cleaning process described above, the second silicide layer 290 extends continuously from the top surface of the second source/drain features 332. In some non-limiting examples, referring to FIGS. 28A and 28B, a thickness T3 of the first silicide layer 388 and a thickness T4 of the second silicide layer 390 (including the optional second metal layer 386) may each be about 5 nm to about 8 nm. Other values for the thicknesses T3 and T4 may also be applicable to embodiments of the present disclosure.

Figure 26:
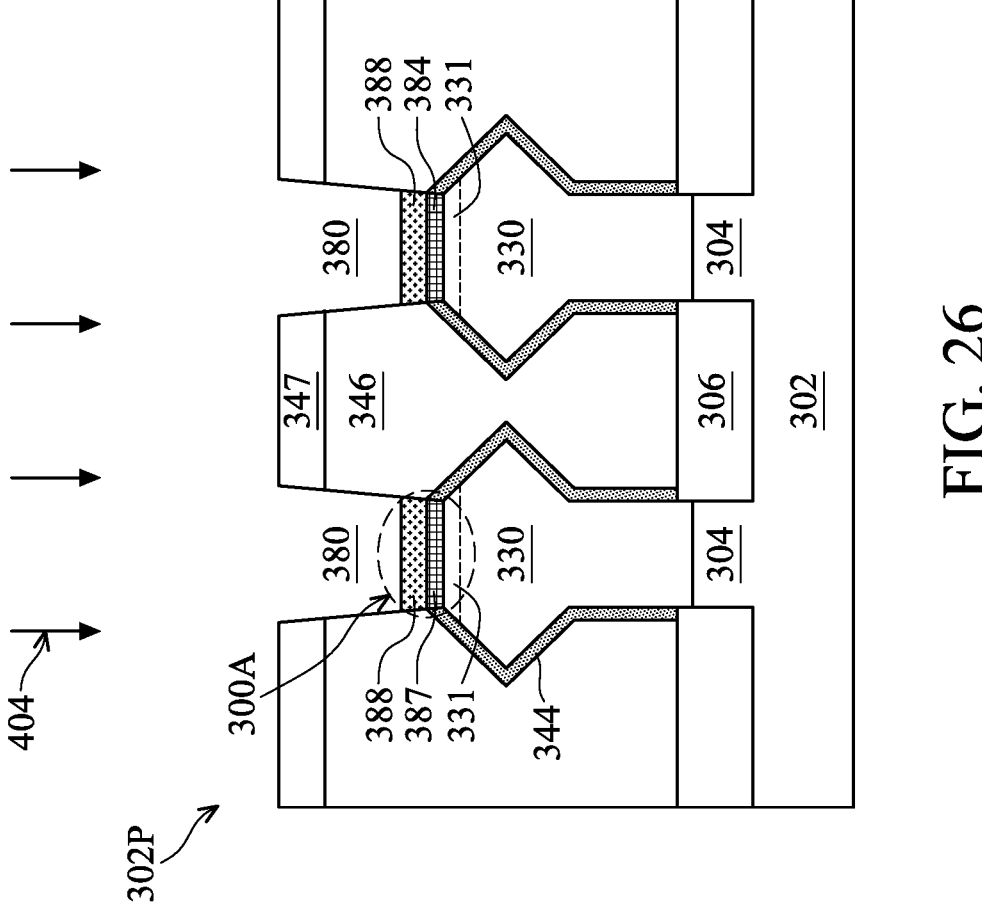

In addition, the metal precursor 404 reacts with Si atoms in the top portion of the first source/drain features 330 to form MoTiSiGe in the interfacial layer 387. Such a reaction depletes the Si atoms in the top portion of the first source/ drain features 330, thereby forming a Ge pile-up region 331 directly below the interfacial layer 387, as depicted in FIGS. 26 and 28A. In this regard, the Ge pile-up region 331 has a concentration of Ge that is greater than that of a bulk portion of the first source/drain features 330. As the interfacial layer 387 directly contacts the first source/drain features 330 and includes TiSi, it may be alternatively referred to as the third silicide layer 387 embedded between the first silicide layer 388 and the first source/drain features 330.

Referring to plot 700 of FIG. 29, which illustrates changes in atomic concentration as a function of distance from a top surface of the first silicide layer 388, the concentration of the first metal M1 (e.g., Mo), evidenced by profile 810, is insignificant or minimal across the first silicide layer 388. The concentration of the first metal M1 begins to increase from a first interface F1 between the first silicide layer 388 and the interfacial layer 387 and continues to increase toward a second interface F2 between the interfacial layer 387 and the first source/drain features 330. The concentration of the second metal M2 (e.g., Ti), evidenced by profile 820, is relatively constant at a pre-determined value consistent with the composition of the TiSi in the first silicide layer 388. The concentration of the second metal M2 begins to decrease at the first interface F1 and continues to decrease toward the second interface F2. The concentration of Ge, evidenced by profile 830, first increases across the interfacial layer 387, reaches a maximum in the Ge pile-up region 331, and then decreases toward a relatively constant level within the bulk of the first source/drain features 330 consistent with the composition of the first source/drain features 330. It is noted that the profiles 810, 820, and 830 illustrated in FIG. 29 are not intended to limit the concentration profile of each element to any particular configuration; rather, they are intended to depict trends of the distribution of each element across various portions of the device 300.

Accordingly, the silicide layer in direct contact with the first source/drain features 330, i.e., the interfacial layer (also referred to as the dipole layer or the third silicide layer) 387, is rich in the first metal M1 (e.g., Mo), while the silicide layer in direct contact with the second source/drain features 332, i.e., the second silicide layer 390, is rich in the second metal M2 (e.g., Ti). In other words, the interfacial layer 387 and the second silicide layer 390 differ in composition. In existing implementations, silicide layers over P-type source/drain features and N-type source/drain features are generally formed from the same metal at a consistent concentration. Depending on a difference in work function between the metal in the silicide layer and the underlying source/drain features, a Schottky barrier height (SBH) between the two layers may cause an increase in contact resistance $R_{csd}$ at an interface therebetween (e.g., the second interface F2). For example, if the metal included the silicide layer is an N-type metal (i.e., having a work function close to that of Si, such as Ti) and the underlying source/drain features are of P-type (e.g., including SiGe) then the SBH and the contact resistance $R_{csd}$ at the interface are higher than if a P-type metal (i.e., having a work function close to that of SiGe, such as Mo) is included in the silicide layer instead. The present disclosure provides methods of selectively forming a P-type metal-containing silicide layer (i.e., the interfacial layer 387) over P-type source/drain features for at least the purpose of reducing the SBH and the contact resistance $R_{csd}$ at the interface. In this regard, the first metal M1 is selected to tune the work function of the interfacial layer 387 to closely match with the work function of the P-type doped semiconductor material of the first source/drain features 330. Similarly, the second metal M2 may to tune the work function of the second silicide layer 390 to closely match with the work function of the N-type doped semiconductor material of the second source/drain features 332.

As described in detail above, the first metal M1 in the interfacial layer 387 is selected to be a P-type metal, e.g., Mo, having a work function similar to that of SiGe. In some embodiments, increasing the concentration of the first metal M1 in the interfacial layer 387 provides better tuning of the work function. Thus, in some embodiments, the P-type dopants (e.g., B) of the first source/drain features 330 may be implanted at a depth farther away from the interfacial layer 387, such as in the region 333, as depicted in FIG. 28A, to reduce or limit interference with the tuning of work function in the interfacial layer 387. Similar adjustment may be made to the N-type dopants (e.g., P) of the second source/drain features 332, where the N-type dopants may be implanted at a depth farther away from the second silicide layer 390.

Referring to FIGS. 2A and 30-32, the method 200 at operation 214 forms a first source/drain contact 392 and a second source/drain contact 394 to fill the first contact opening 380 and the second contact opening 382, respectively. In the present embodiments, the first source/drain contact 392 couples with the first source/drain features 330 through the first silicide layer 388 and the interfacial layer 387, and the second source/drain contact 394 couples with the second source/drain features 332 through the second silicide layer 390.

The first source/drain contact 392 and the second source/drain contact 394 may each include any suitable metal, such as W, Cu, Ru, Al, Au, Co, the like, or combinations thereof. The first source/drain contact 392 and the second source/drain contact 394 may be formed by depositing a metal layer to fill the first contact opening 280 and the second contact opening 282, and performing a planarization process, such as a CMP process, to planarize the metal layer and form the source/drain contact 292. A barrier layer (not depicted) may be formed in the first contact opening 280 and the second contact opening 282 before depositing the metal layer. The barrier layer may include any suitable material, such as Ti, Ta, TiN, TaN, the like, or combinations thereof.

Thereafter, the method 200 may perform additional operations to the device 300. For example, interconnect features (e.g., vias and conductive lines) may be formed in various metallization layers (e.g., dielectric layers similar to the ILD layer 346) to electrically couple components of the device 300 with additional features.

Although embodiments of the present disclosure have been described using a FinFET device 300 as an example, such embodiments may also be application in other configurations of non-planar transistor devices. For example, referring to FIGS. 33A-33D, a portion of an example vertical, multi-gate complementary field-effect transistor (CFET) device 900 (hereafter referred to as device 900) is illustrated. The device 900 is analogous to the device 300 in that they each include a P-type device (e.g., the device D1) and an N-type device (e.g., the device D2) formed from a three-dimensional semiconductor layer (e.g., the fin 304), metal gate structures (e.g., the metal gate structures 360), and source/drain features (e.g., the first source/drain features 330 and the second source/drain features 332). In the views of FIGS. 33A-33D, which are analogous to those of the device 300 taken along line C-C, gate structures and channel regions of the device 900 are not depicted.

In comparison to the device 300, the device 900 includes the device D1 and the device D2 stacked vertically along a direction that protrudes from the substrate 302, i.e., along a vertical height of the fin 304 (not depicted). In this regard, the devices D1 and D2's respective source/drain features, the first source/drain features 330 and the second source/drain features 332, are stacked vertically and arranged adjacent their respective channel regions (not depicted) along a longitudinal axis of the fin 304. Each channel region may include a plurality of semiconductor layers similar to those of a nanosheet or GAA transistor device. The device 900 further includes the CESL 344, the ILD layer 346 over the first source/drain features 330 and the second source/drain features 332, similar to those of the device 300. A replacement gate process, similar to that of operation 211, may be implemented to form a first metal gate structure (not depicted) and a second metal gate structure (not depicted) over their respective channel regions.

Figure 33B:
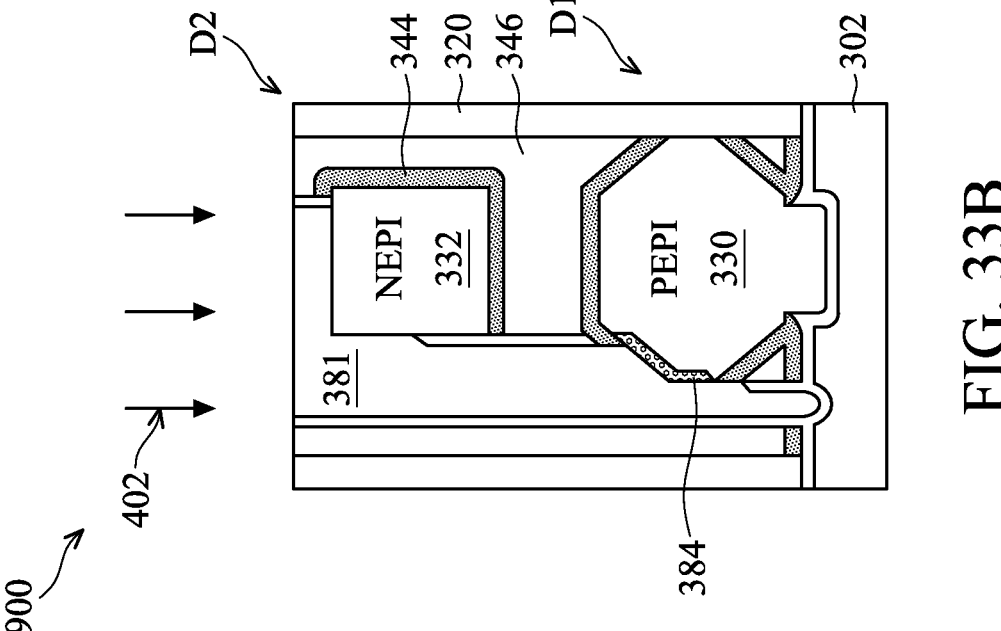
Figure 33A:
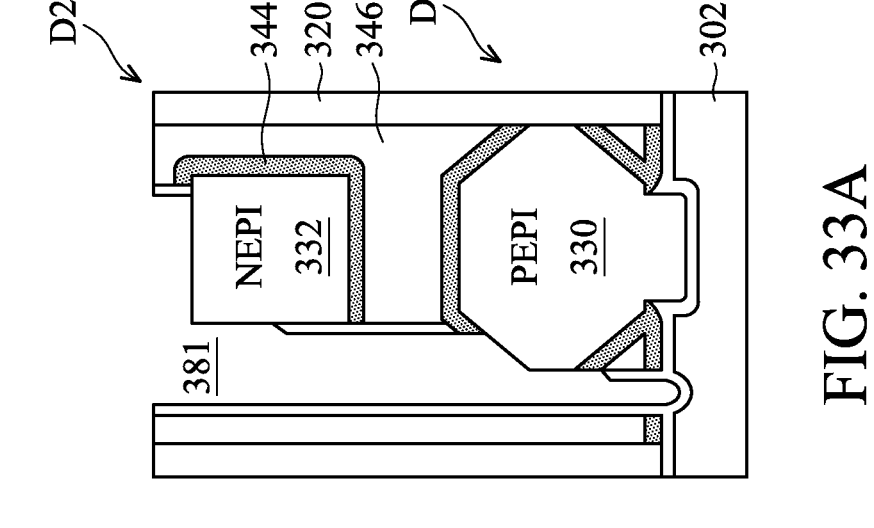
Figure 33D:
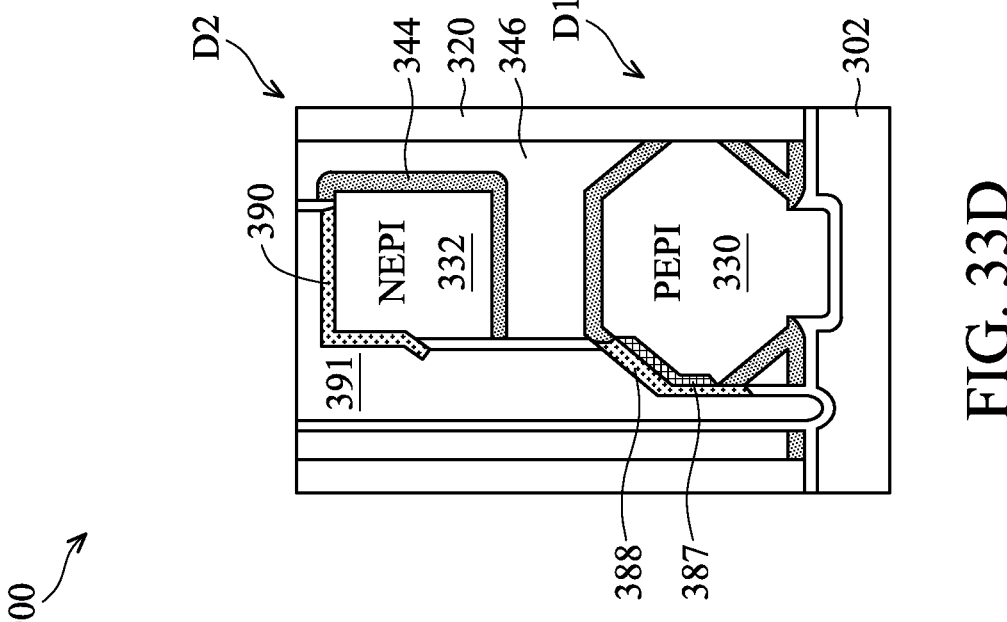
Figure 33C:
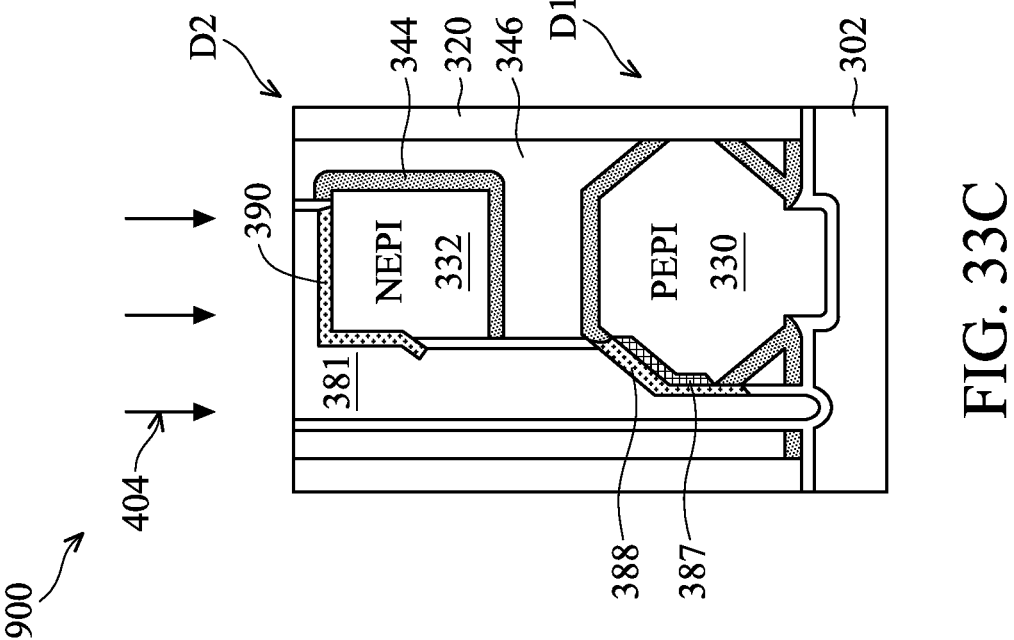

Subsequently, in an operation similar to operation 252, a vertical contact opening 381 is formed in the ILD layer 346 to extend along sidewalls of the first source/drain features 330 and the second source/drain features 332 as shown in FIG. 33A. Referring to FIG. 33B, in an operation similar to operation 254, the metal halide 402 containing the first metal M1 is applied in the vertical contact opening 381 to form the first metal layer 384 over the first source/drain features 330. The second metal layer 386 may be formed over the second source/drain features 332 as depicted with respect to the device 300. Alternatively, the second metal layer 386 may be removed (by the cleaning process, for example), such as that depicted in FIG. 33B. Referring to FIG. 33C, in an operation similar to operation 256, the metal precursor 404 containing the second metal M2 is applied in the vertical contact opening 381, thereby forming the interfacial layer 387 and the first silicide layer 388 over the first source/drain features 330 and also forming the second silicide layer 390 over the second source/drain features 332. Thereafter, referring to FIG. 33D, a source/drain contact 391 is formed in the vertical contact opening 381 in an operation similar to operation 214. In this regard, the source/drain contact 391 directly contacts both the first silicide layer 388 and the second silicide layer 390.

The present disclosure provides a semiconductor device (e.g., a FinFET device, a vertical transistor device), and a method of forming the same, that includes an interfacial layer selectively formed over P-type source/drain features. In some embodiments, the interfacial layer includes a P-type metal configured to lower the SBH and contact resistance between an overlaying silicide layer and the underlying P-type source/drain features by adjusting a difference in their work functions. In some embodiments, the silicide layer includes a metal different from the P-type metal, such as an N-type metal, and is formed over the interfacial layer and over the N-type source/drain features. In this regard, the interfacial layer differs from the silicide layer in composition, allowing the work function be tuned differently between at the P-type source/drain features and the N-type source/drain features.

In an aspect of the present disclosure, a semiconductor device includes a semiconductor layer protruding from a substrate, where the semiconductor layer includes a first channel region and a second channel region. The semiconductor device includes a first source/drain (S/D) feature in the semiconductor layer adjacent the first channel region, where the first S/D feature is configured as a P-type S/D feature. The semiconductor device includes a second S/D feature in the semiconductor layer adjacent the second channel region, where the second S/D feature is configured as an N-type S/D feature. The semiconductor device includes a first silicide layer over the first S/D feature, where the first silicide layer includes a first metal. The semiconductor device includes an interfacial layer between the first silicide layer and the first S/D feature, where the interfacial layer includes the first metal and a second metal different from the first metal, and where a concentration of the second metal is greater than a concentration of the first metal. The semiconductor device further includes a second silicide layer over and directly contacting the second S/D feature, where the second silicide layer includes the first metal.

In another aspect of the present disclosure, a semiconductor device includes a substrate and a semiconductor fin protruding from the substrate. The semiconductor device includes a P-type device over the semiconductor fin and an N-type device over the semiconductor fin. The P-type device includes a first gate structure engaging with a first channel region of the semiconductor fin. The P-type device includes a first source/drain (S/D) feature adjacent the first gate structure, where the first S/D feature includes silicon germanium. The P-type device includes a dipole layer over the first S/D feature, where the dipole layer includes a first metal and a second metal different from the first metal. The P-type device further includes a first silicide layer over the dipole layer, where the first silicide layer includes the first metal. The N-type device includes a second gate structure engaging with a second channel region of the semiconductor fin. The N-type device includes a second S/D feature adjacent the second gate structure, where the second S/D feature includes silicon. The N-type device further includes a second silicide layer directly contacting the second S/D feature, where the second silicide layer includes the first metal, and where a composition of the second silicide layer is different from that of the dipole layer.

In yet another aspect of the present disclosure, a method includes forming a semiconductor layer protruding from a substrate, where the semiconductor layer includes a first channel region and a second channel region. A method includes forming a first source/drain (S/D) feature in the semiconductor layer adjacent the first channel region and a second S/D feature adjacent the second channel region, where the first S/D feature includes silicon germanium doped with a P-type dopant and the second S/D feature includes silicon doped with an N-type dopant. A method includes depositing a metal halide over the first S/D feature and the second S/D feature to form a first metal layer and a second metal layer, respectively, where the metal halide includes a first metal. A method further includes depositing a metal precursor having a second metal over the first S/D feature and the second S/D feature to an interfacial layer to directly contact the first S/D feature, a first silicide layer over the interfacial layer, and a second silicide layer to directly contact the second S/D feature, where the first silicide layer and the second silicide layer each include the second metal that is different from the first metal, and where the interfacial layer differs from the second silicide layer in composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor layer protruding from a substrate, the semiconductor layer including a first channel region and a second channel region;
a first source/drain (S/D) feature in the semiconductor layer adjacent the first channel region, the first S/D feature configured as a P-type S/D feature;
a second S/D feature in the semiconductor layer adjacent the second channel region, the second S/D feature configured as an N-type S/D feature;
a first silicide layer over the first S/D feature and including a first metal;
an interfacial layer between the first silicide layer and the first S/D feature, the interfacial layer including the first metal and a second metal different from the first metal, wherein a concentration of the second metal is greater than a concentration of the first metal; and
a second silicide layer over and directly contacting the second S/D feature, the second silicide layer including the first metal.

2. The semiconductor device of claim 1, wherein the second metal includes molybdenum, ruthenium, nickel, cobalt, platinum, tungsten, or combinations thereof.

3. The semiconductor device of claim 1, wherein the first S/D feature includes silicon germanium and the second S/D feature includes silicon, and wherein the interfacial layer further includes silicon and germanium.

4. The semiconductor device of claim 3, wherein the first S/D feature includes a Ge pile-up region adjacent the interfacial layer.

5. The semiconductor device of claim 1, wherein a concentration of the first metal in the first silicide layer is greater than a concentration of the first metal in the interfacial layer.

6. The semiconductor device of claim 1, wherein the concentration of the second metal is greater than a concentration of the first metal in the interfacial layer near the first S/D feature.

7. The semiconductor device of claim 1, wherein the concentration of the second metal increases across the interfacial layer toward the first S/D feature.

8. The semiconductor device of claim 1, wherein the concentration of the first metal decreases across the interfacial layer toward the first S/D feature.

9. A semiconductor device, comprising:
a substrate;
a semiconductor fin protruding from the substrate;
a P-type device over the semiconductor fin, including:
a first gate structure engaging with a first channel region of the semiconductor fin;
a first source/drain (S/D) feature adjacent the first gate structure;
a dipole layer over the first S/D feature and including a first metal and a second metal different from the first metal;
a first silicide layer over the dipole layer, the first silicide layer including the first metal; and
an interfacial layer disposed between the first S/D feature and the first silicide layer; and
an N-type device over the semiconductor fin, including:
a second gate structure engaging with a second channel region of the semiconductor fin;
a second S/D feature adjacent the second gate structure; and a second silicide layer directly contacting the second S/D feature, the second silicide layer including the first metal and having a composition different from that of the dipole layer.

10. The semiconductor device of claim 9, further comprising:
a first S/D contact coupled with the first S/D feature through the dipole layer and the first silicide layer; and
a second S/D contact coupled with the second S/D feature through the second silicide layer.

11. The semiconductor device of claim 9, wherein the P-type device and the N-type device are stacked vertically along a direction protruding from the substrate, the semiconductor device further comprising an S/D contact extending along sidewalls of the first S/D feature and the second S/D feature, wherein the S/D contact is coupled with the first S/D feature through the dipole layer and the first silicide layer and with the second S/D feature through the second silicide layer.

12. The semiconductor device of claim 9, wherein the first S/D feature includes silicon and germanium, wherein the first S/D feature directly contacts the dipole layer at a first interface, and wherein a concentration of germanium decreases from the first interface toward a bulk portion of the first S/D feature.

13. The semiconductor device of claim 12, wherein the dipole layer directly contacts the first silicide layer at a second interface, wherein a concentration of the first metal decreases from the second interface toward the first interface, wherein a concentration of the second metal increases from the second interface toward the first interface, and wherein a concentration of germanium increases from the second interface toward the first interface.

14. A semiconductor device, comprising:
a substrate;
a first device comprising a first source/drain feature and a first channel region arranged adjacent the first source/drain feature;
a second device comprising a second source/drain feature and a second channel region arranged adjacent the first source/drain feature,
wherein the first device and the second device are stacked vertically along a first direction that protrudes from the substrate;
wherein the second source/drain feature is stacked over the first source/drain feature along the first direction; and
a contact opening extending along sidewalls of the first source/drain feature and the second source/drain feature in the first direction.

15. The semiconductor device of claim 14, further comprising:
an etch stop layer disposed over the first source/drain feature and the second source/drain feature; and
an interlayer dielectric disposed over the first source/drain feature and the second source/drain feature.

16. The semiconductor device of claim 14, further comprising a first metal layer disposed over the first source/drain feature and a second metal layer disposed over the second source/drain feature.

17. The semiconductor device of claim 16, wherein the first metal layer and the second metal layer each comprise a metal halide.

18. The semiconductor device of claim 14, further comprising a first dipole layer disposed over the first source/drain feature.

19. The semiconductor device of claim 18, further comprising a first silicide layer disposed over the first dipole layer and a second silicide layer disposed over the second source/drain feature.

20. The semiconductor device of claim 19, further comprising a contact disposed in the contact opening, wherein the contact is in contact with the first silicide layer and the second silicide layer.

5

\*    \*    \*    \*    \*